(12) United States Patent
Inoue et al.

(10) Patent No.: US 9,076,875 B2
(45) Date of Patent: Jul. 7, 2015

(54) THIN FILM TRANSISTOR SUBSTRATE WITH PIXEL MATRIX

(71) Applicant: Mitsubishi Electric Corporation, Tokyo (JP)

(72) Inventors: Kazunori Inoue, Kumamoto (JP); Nobuaki Ishiga, Kumamoto (JP); Kensuke Nagayama, Kumamoto (JP); Naoki Tsumura, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/951,338

(22) Filed: Jul. 25, 2013

(65) Prior Publication Data

US 2014/0042430 A1 Feb. 13, 2014

(30) Foreign Application Priority Data

Aug. 10, 2012 (JP) .................................. 2012-177958

(51) Int. Cl.
*H01L 27/14* (2006.01)
*H01L 29/786* (2006.01)
*H01L 27/12* (2006.01)

(52) U.S. Cl.
CPC ........ *H01L 29/7869* (2013.01); *H01L 27/1225* (2013.01); *H01L 27/124* (2013.01)

(58) Field of Classification Search
CPC ............ H01L 27/1214; H01L 29/7869; H01L 27/1224; H01L 27/124
USPC ....................................................... 257/72
See application file for complete search history.

(56) References Cited

U.S. PATENT DOCUMENTS

| 5,508,765 | A * | 4/1996 | Nakagawa et al. ............. 349/42 |
| 8,324,612 | B2 | 12/2012 | Lee et al. |
| 2003/0075715 | A1 | 4/2003 | Satoh et al. |
| 2008/0191211 | A1 | 8/2008 | Yano et al. |
| 2009/0189153 | A1 | 7/2009 | Iwasaki et al. |

(Continued)

FOREIGN PATENT DOCUMENTS

| JP | 2003-092410 A | 3/2003 |
| JP | 2005-077822 A | 3/2005 |

(Continued)

OTHER PUBLICATIONS

K.Nomura et al; "Room-temperature fabrication of transparent flexible thin-film transistors using amorphous oxide semiconductors"; Nature vol. 432; pp. 488-492; Nov. 25, 2004.

*Primary Examiner* — Ajay K Arora
(74) *Attorney, Agent, or Firm* — Studebaker & Brackett PC

(57) ABSTRACT

A thin film transistor substrate includes a thin film transistor, a source wire, an upper-layer source wire, and a pixel electrode. The thin film transistor includes: a source electrode and a drain electrode located to be spaced from each other on the same plane; a semiconductor film located to straddle those electrodes; an insulating film located to cover at least the source electrode, the drain electrode, and the semiconductor film; an upper-layer source electrode and an upper-layer drain electrode located on the insulating film and respectively connected to the semiconductor film through contact holes; and a gate electrode located below or above the semiconductor film. The source wire extends from the source electrode. The upper-layer source wire extends from the upper-layer source electrode. The pixel electrode is electrically connected to the drain electrode.

17 Claims, 35 Drawing Sheets

(56) References Cited

U.S. PATENT DOCUMENTS

2010/0296042 A1* 11/2010 Yonemura ................. 349/143
2011/0084267 A1*  4/2011 Yamazaki et al. ............ 257/43
2012/0187405 A1*  7/2012 Imamura .................... 257/59

FOREIGN PATENT DOCUMENTS

| JP | 2006-005329 A | 1/2006 |
| JP | 2007-281409 A | 10/2007 |
| JP | 2008-227442 A | 9/2008 |

* cited by examiner

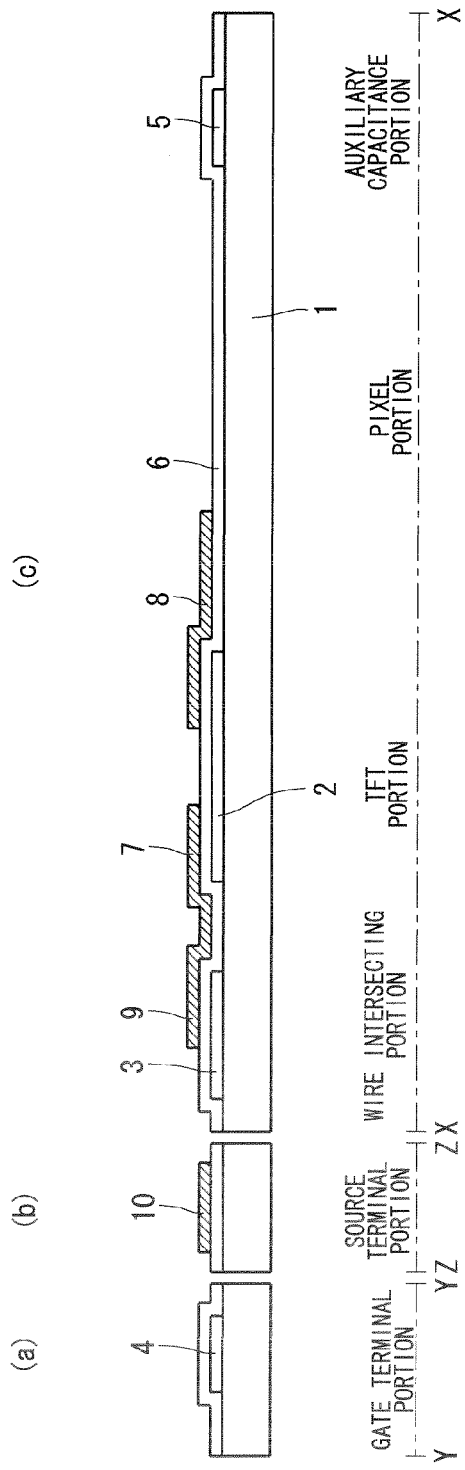

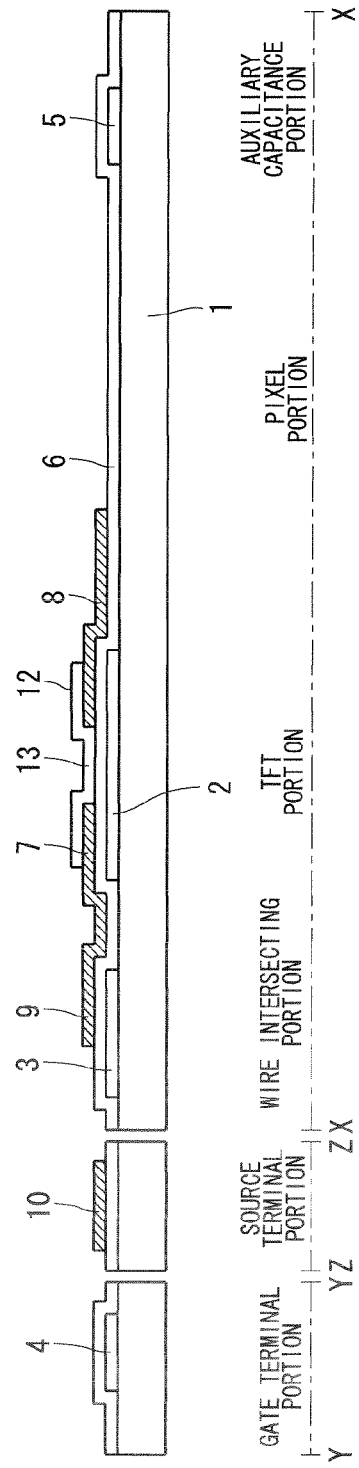

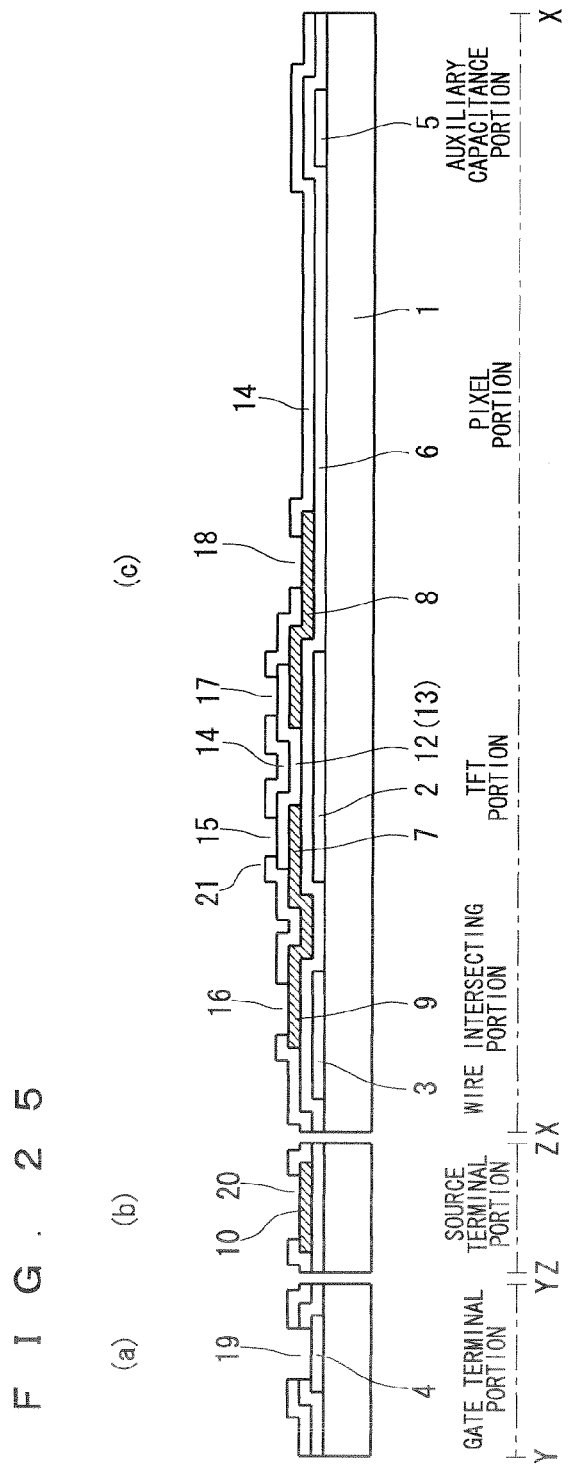

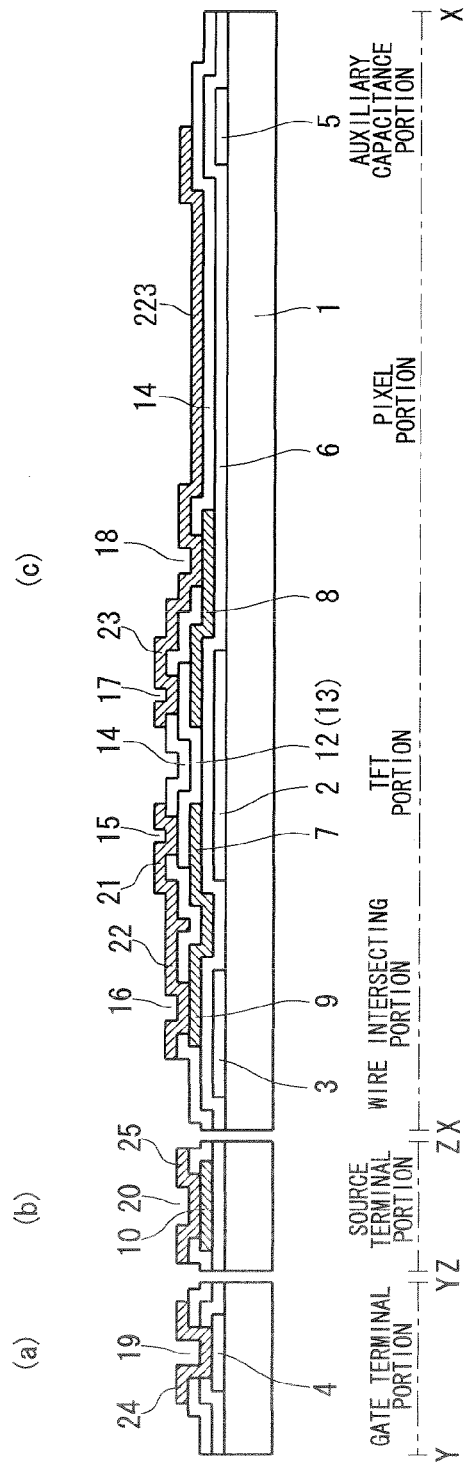

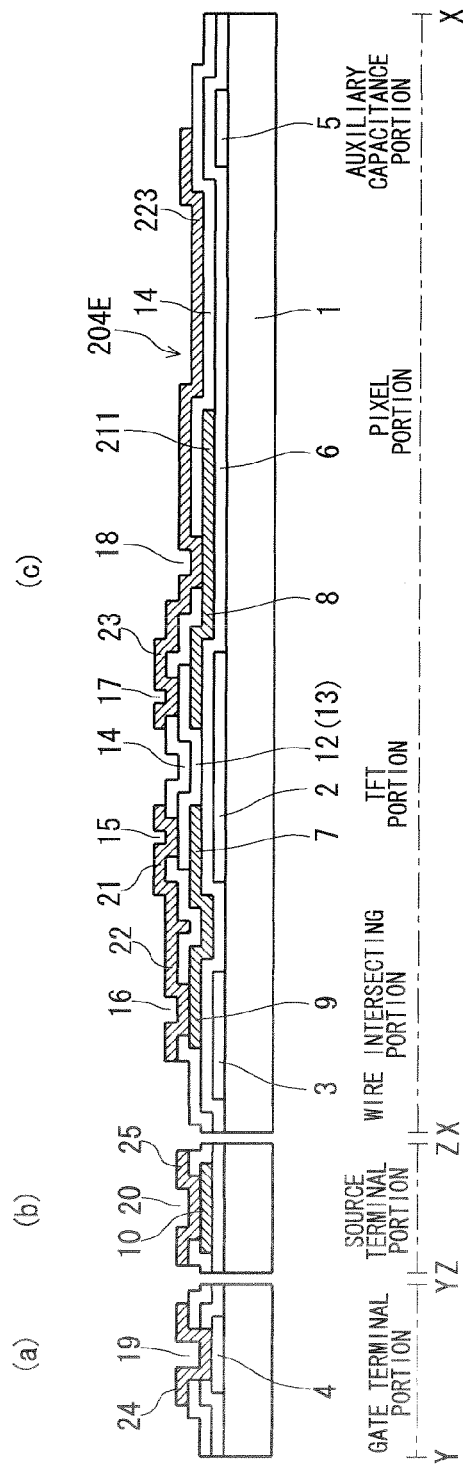

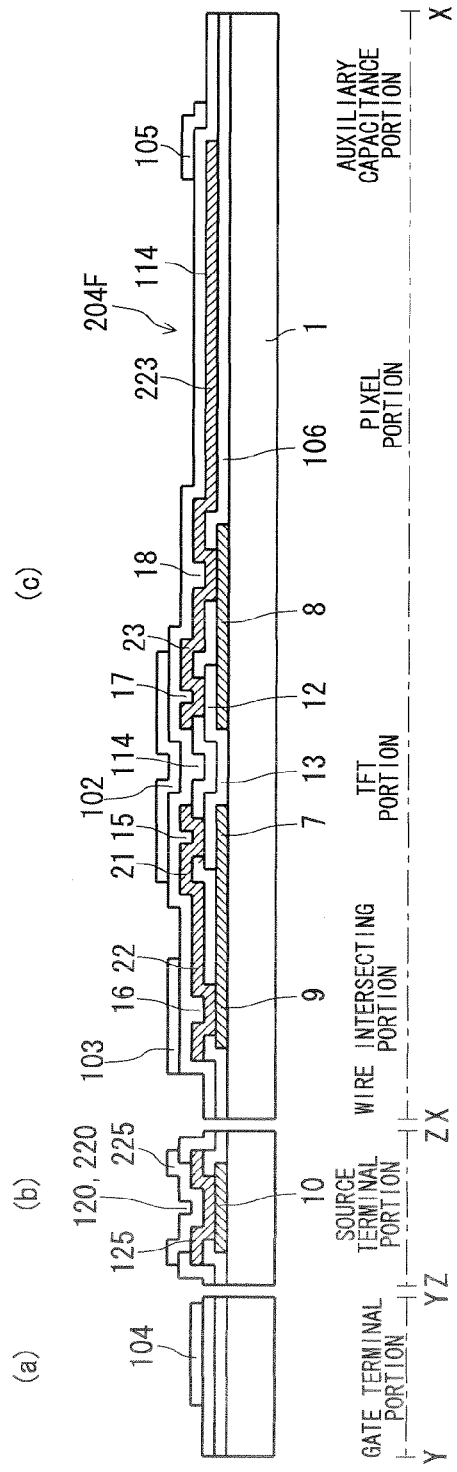

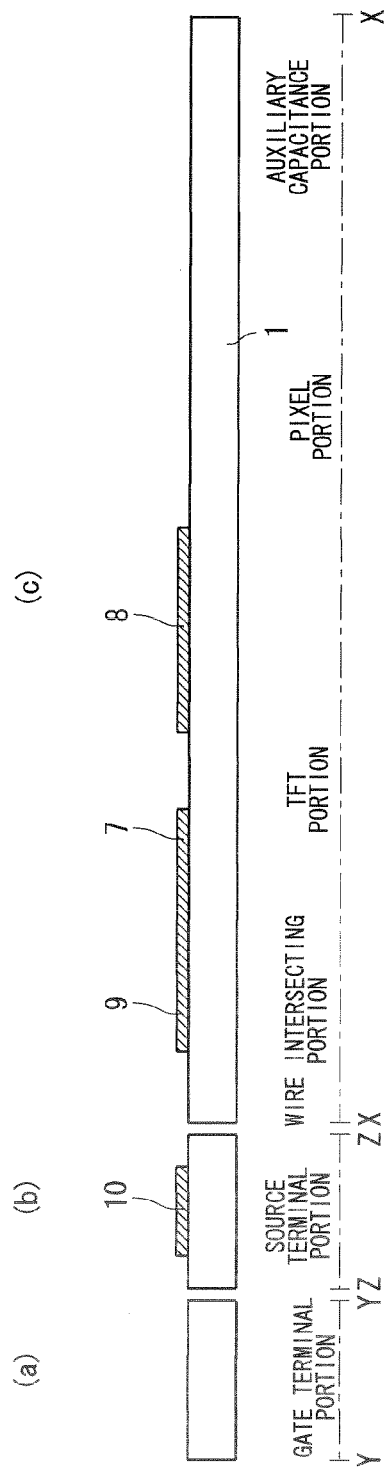

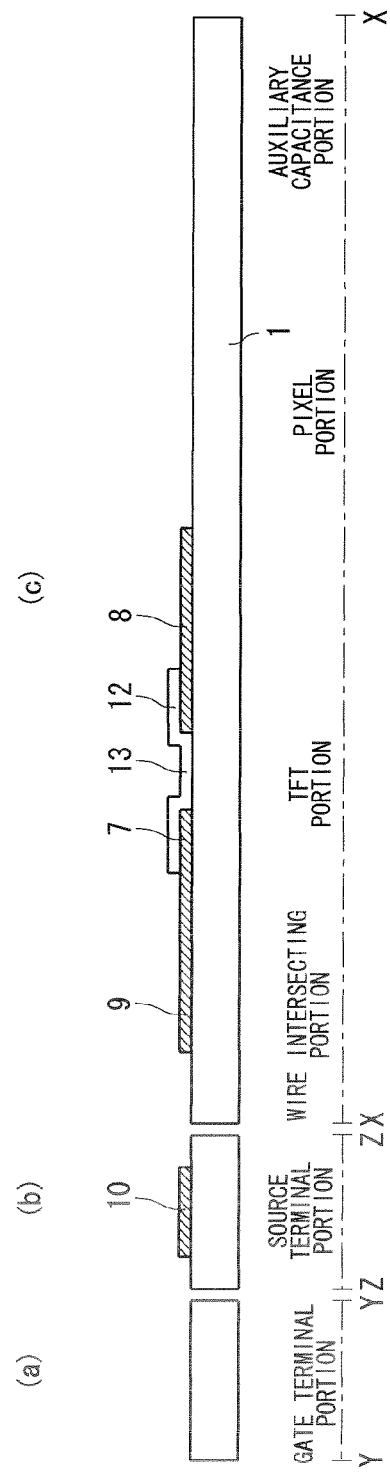

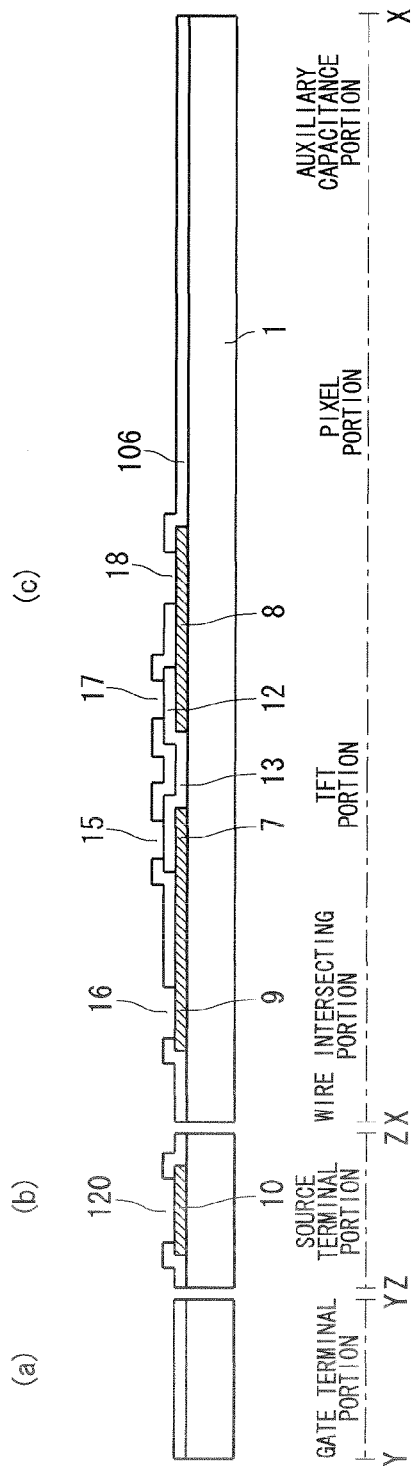

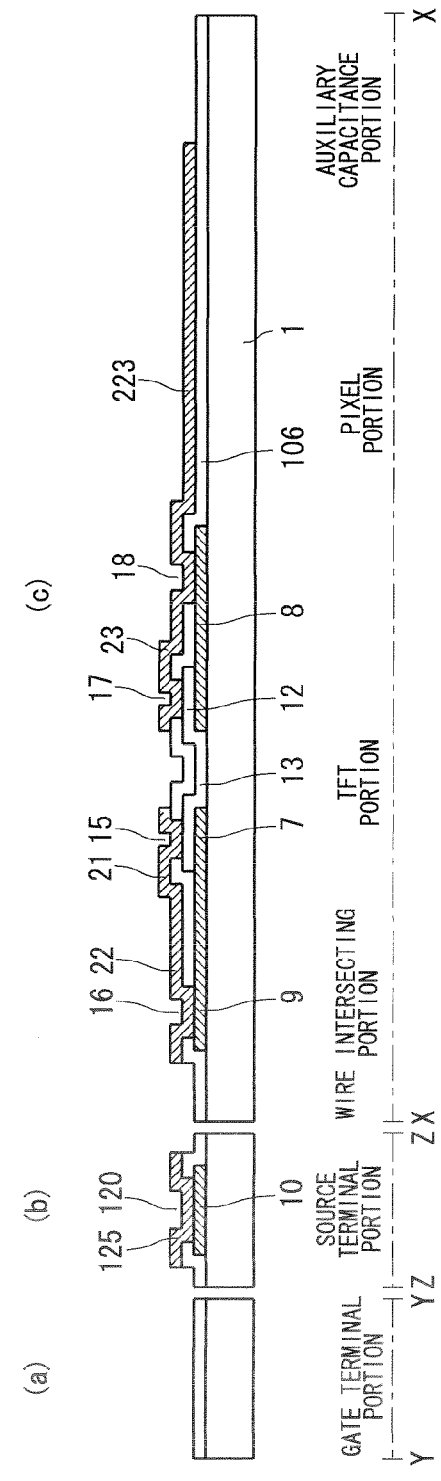

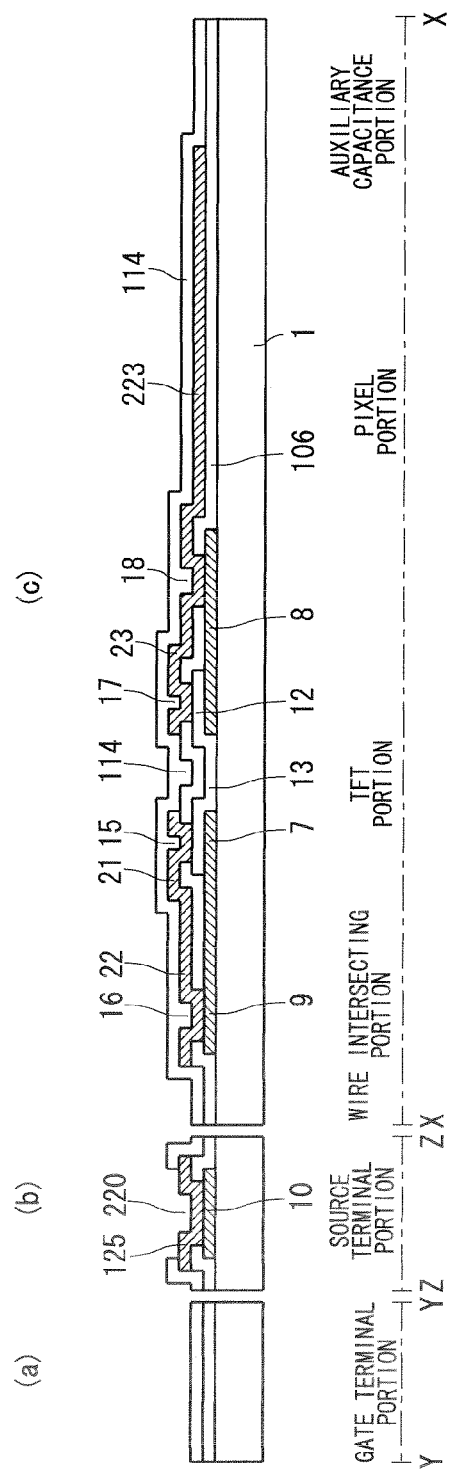

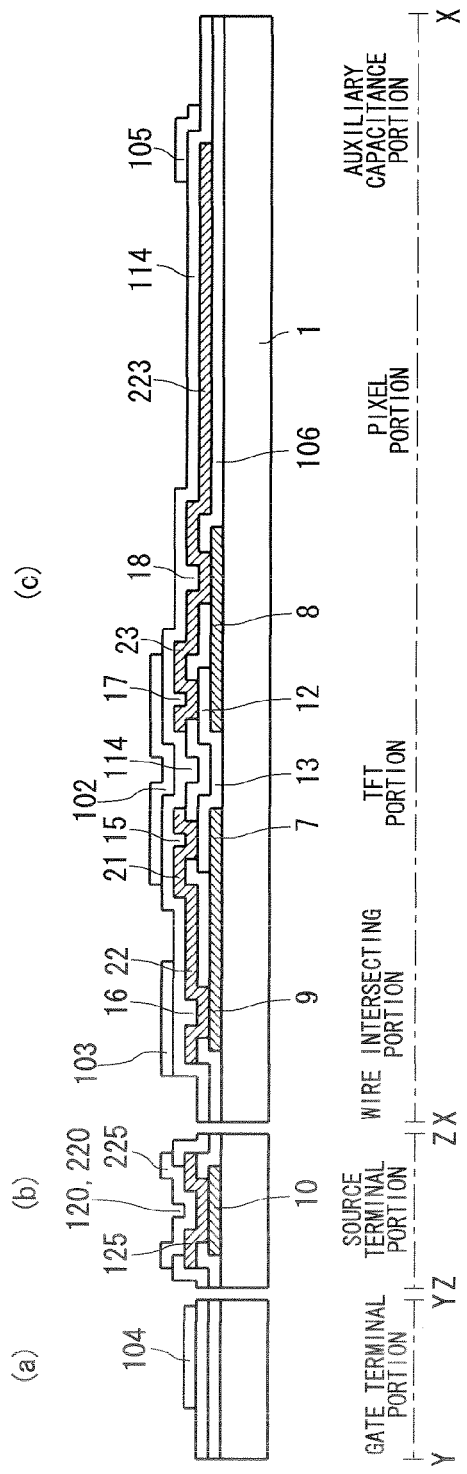

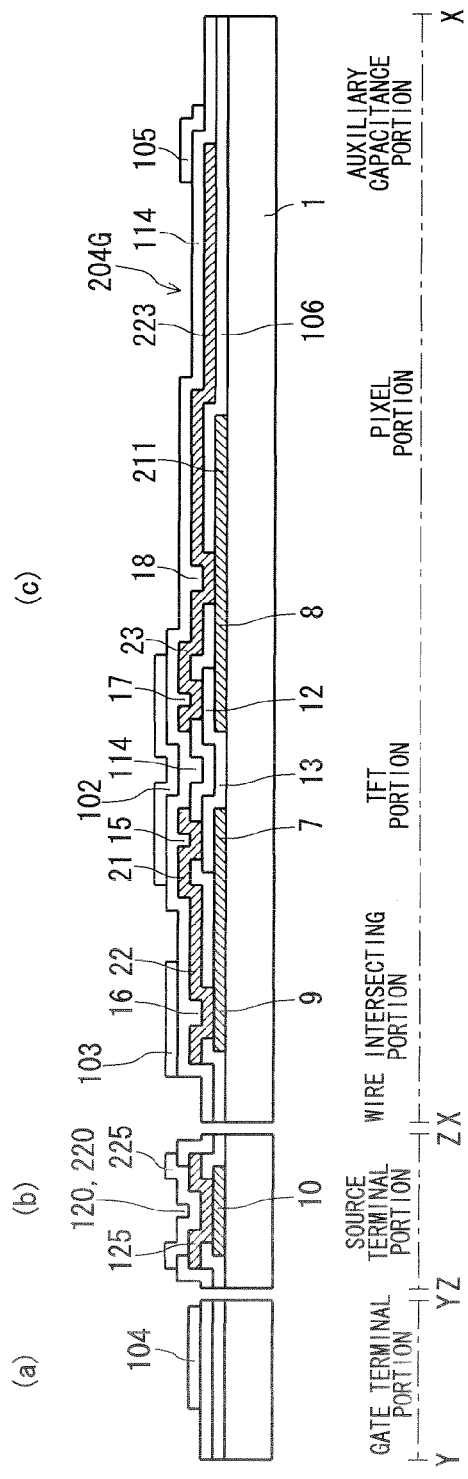

THIN FILM TRANSISTOR SUBSTRATE WITH PIXEL MATRIX

BACKGROUND OF THE INVENTION

Field of the Invention

The present invention relates to a thin film transistor substrate forming a display device.

A thin film transistor (hereinafter, referred to as "TFT") active matrix substrate (hereinafter, referred to as "TFT substrate") including a TFT as a switching element is used in, for example, electro-optical devices such as a display device including liquid crystals (hereinafter, referred to as "liquid crystal display device").

The semiconductor device such as TFT is characterized in lower power consumption and slimness. Accordingly, with the use of such characteristics, the semiconductor devices are actively applied to flat panel displays that replace cathode ray tubes (CRTs).

Conventionally, amorphous silicon (Si) has been used as a semiconductor active layer in a switching element of a TFT substrate for a liquid crystal display device. Further, in recent years, a TFT including an oxide semiconductor for an active layer (channel layer) has been actively developed. The oxide semiconductor has mobility higher than that of conventional amorphous silicon. Zinc oxide (ZnO)-based materials and an amorphous InGaZnO-based material obtained by adding a gallium oxide ($Ga_2O_3$) and an indium oxide ($In_2O_3$) to a zinc oxide are mainly used as an oxide semiconductor. This technique is disclosed in, for example, Japanese Patent Application Laid-Open Nos. 2005-77822 and 2007-281409, and Kenji Nomura et al., 2004 "Room-temperature fabrication of transparent flexible thin-film transistors using amorphous oxide semiconductors", Nature, 432, pp. 488-492.

Similarly to oxide conductive materials such as amorphous ITO (indium oxide $In_2O_3$+tin oxide $SnO_2$) and amorphous IZO (indium oxide $In_2O_3$+zinc oxide ZnO) that are well-known as transparent conductive materials, the above-mentioned oxide semiconductor materials can be etched with weak acid solutions such as oxalic acid and carboxylic acid and are advantageously patterned with ease.

On the other hand, however, those oxide semiconductor materials easily dissolve in weak acid solutions normally used in etching typical metal films (Cr, Ti, Mo, Ta, Al, Cu, and alloys thereof) used for a source electrode and a drain electrode of a TFT.

Therefore, for example, in a case of manufacturing a TFT including a source electrode and a drain electrode above an oxide semiconductor as disclosed in FIG. 11 of Japanese Patent Application Laid-Open No. 2005-77822, selective etching is difficult, in which only metal films of the source electrode and drain electrode are etched and the oxide semiconductor is not etched to be left.

In order to solve the above-mentioned problem, for example, it is conceivable to adopt a TFT structure in which an active layer is provided on a source electrode and a drain electrode, as disclosed in FIG. 1 of Japanese Patent Application Laid-Open No. 2003-92410 and FIG. 1A of Japanese Patent Application Laid-Open No. 2006-5329. In this TFT structure, a semiconductor active layer can be formed after processing a metal film to form a gate electrode, a source electrode, and a drain electrode. Besides, the active layer is not affected by and does not dissolve in an acid solution in etching the metal film. Further, weak acid solutions such as oxalic acid and carboxylic acid in etching an oxide-based semiconductor film forming the active layer do not etch a typical metal film. Accordingly, the process by selective etching with an oxide semiconductor and a metal film can be performed, which enables to manufacture a high-performance and high-mobility TFT substrate.

Unfortunately, if an oxide-based semiconductor film such as ZnO and InGaZnO is directly formed on a metal film (Cr, Ti, Cu, Mo, Ta, Al, and alloys thereof) that is used for a source electrode and a drain electrode of a TFT by a well-known sputtering process or vacuum evaporation process, an oxide layer of a metal film is formed at an interface therebetween due to an interface reaction, which increases an electrical resistance (interface resistance).

The experimental results by the inventors have shown that, for example, in a case of Al, when an InGaZnO (atom number ratio In:Ga:Zn:O=1:1:1:4) oxide-based semiconductor film was formed on an Al electrode formed therebelow, an interface resistance value was 200 k$\Omega$ for each 50 $\mu$m×50 $\mu$m area. Meanwhile, in a case where Al and InGaZnO were reversed, an interface resistance value was 100 M$\Omega$ or more.

As to other metals (Cr, Ti, Cu, Mo, Ta), the interface resistance values thereof increase by at least one digit when those metals and an InGaZnO film are reversed as in the case of Al. Such a behavior holds true for a case of an alloy film containing such a metal film (component having the highest ratio of the number of atoms contained) as a main component. Meanwhile, a reduction reaction with the metal film occurs in the oxide-based semiconductor film, and an oxygen-deficient oxide semiconductor layer is generated on a channel surface in the vicinity of an interface. The oxygen-deficient oxide semiconductor layer as described above has an increased carrier density and decreased resistance, leading to an increase in off-current of the TFT.

As described above, in a case of the TFT structure in which an oxide-based semiconductor film is formed as an upper layer of the source electrode and drain electrode formed of a metal film, an interface reaction layer therebetween becomes large, which leads to a problem that the on-off characteristics and mobility of the TFT are degraded and TFT characteristics are deteriorated.

SUMMARY OF THE INVENTION

An object of the present invention is to provide a thin film transistor substrate including a high-performance thin film transistor including an oxide semiconductor as an active layer.

A thin film transistor substrate according to the present invention is a thin film transistor substrate including a plurality of pixels arranged in matrix. Each of the pixels includes: a thin film transistor, a source wire, an upper-layer source wire, third and fourth contact holes, and a pixel electrode. The thin film transistor includes: a source electrode and a drain electrode located to be spaced from each other on the same plane; a semiconductor film located to straddle the source electrode and the drain electrode; an insulating film located to cover at least the source electrode, the drain electrode, and the semiconductor film; first and second contact holes passing through the insulating film and reaching the semiconductor film located on the source electrode and the drain electrode, respectively; an upper-layer source electrode and an upper-layer drain electrode located on the insulating film and connected to the semiconductor film through the first and second contact holes, respectively; and a gate electrode located below or above the semiconductor film. The source wire extends from the source electrode. The upper-layer source wire extends from the upper-layer source electrode. The third and fourth contact holes pass through the insulating film and reach the source wire and the drain electrode, respectively. The pixel electrode is electrically connected to the drain electrode. In the thin film transistor substrate, the upper-layer source wire and the upper-layer drain electrode are connected to the source wire and the drain electrode through the third and fourth contact holes, respectively.

According to the thin film transistor substrate, the source electrode and the drain electrode are electrically connected to the upper-layer source electrode and the upper-layer drain electrode, respectively, on the upper and lower surfaces of the semiconductor film. This increases a contact area with the semiconductor film, and an interface resistance can be reduced further.

Further, even if the interface resistance of one of the two interfaces between the source electrode and the semiconductor film and between the upper-layer source electrode and the semiconductor film is high, the other interface can compensate for the high interface resistance. Also, even if the interface resistance of one of the two interfaces between the drain electrode and the semiconductor film and between the upper-layer drain electrode and the semiconductor film is high, the other interface can compensate for the high interface resistance. Accordingly, the interface resistance can be kept low, and an occurrence of defects due to poor thin film transistor characteristics can be prevented.

Further, the thin film transistor substrate adopts a dual layer structure of a source wire and an upper-layer source wire, and thus, even in a case where a poor pattern occurs in one of the wires and the source wire is broken, the other wire can compensate for the broken one. This enables to efficiently prevent an occurrence of defects due to a broken wire.

Further, a TFT substrate whose operating speed is high and a display device including the same can be manufactured at high yield by achieving a TFT substrate including an oxide-based semiconductor film having high mobility. Therefore, a high-performance TFT substrate and a liquid crystal display device can be manufactured with high productivity.

These and other objects, features, aspects and advantages of the present invention will become more apparent from the following detailed description of the present invention when taken in junction with the accompanying drawings.

BRIEF DESCRIPTION OF THE DRAWINGS

FIGS. 22 to 26 are cross-sectional views each showing the step of manufacturing the TFT substrate according to the third preferred embodiment of the present invention;

FIG. 27 is a view showing a cross-sectional view of a modification of the TFT substrate according to the third preferred embodiment of the present invention;

FIG. 28 is a view showing a cross-sectional view of a pixel of a TFT substrate according to a fourth preferred embodiment of the present invention;

FIGS. 29 to 33 are cross-sectional views each showing the step of manufacturing the TFT substrate according to the fourth preferred embodiment of the present invention;

FIG. 34 is a view showing the cross-sectional configuration of a modification of the TFT substrate according to the fourth preferred embodiment of the present invention; and FIG. 35 is a view showing the cross-sectional configuration of the modification of the TFT substrate according to the fourth preferred embodiment of the present invention.

DESCRIPTION OF THE PREFERRED EMBODIMENTS

<First Preferred Embodiment>

Description is given below assuming that a TFT substrate according to this preferred embodiment is an active matrix substrate including a thin film transistor as a switching element.

The TFT substrate is used for a flat panel display such as a liquid crystal display (LCD).

<Overall Configuration of TFT Substrate>

Figure 1:
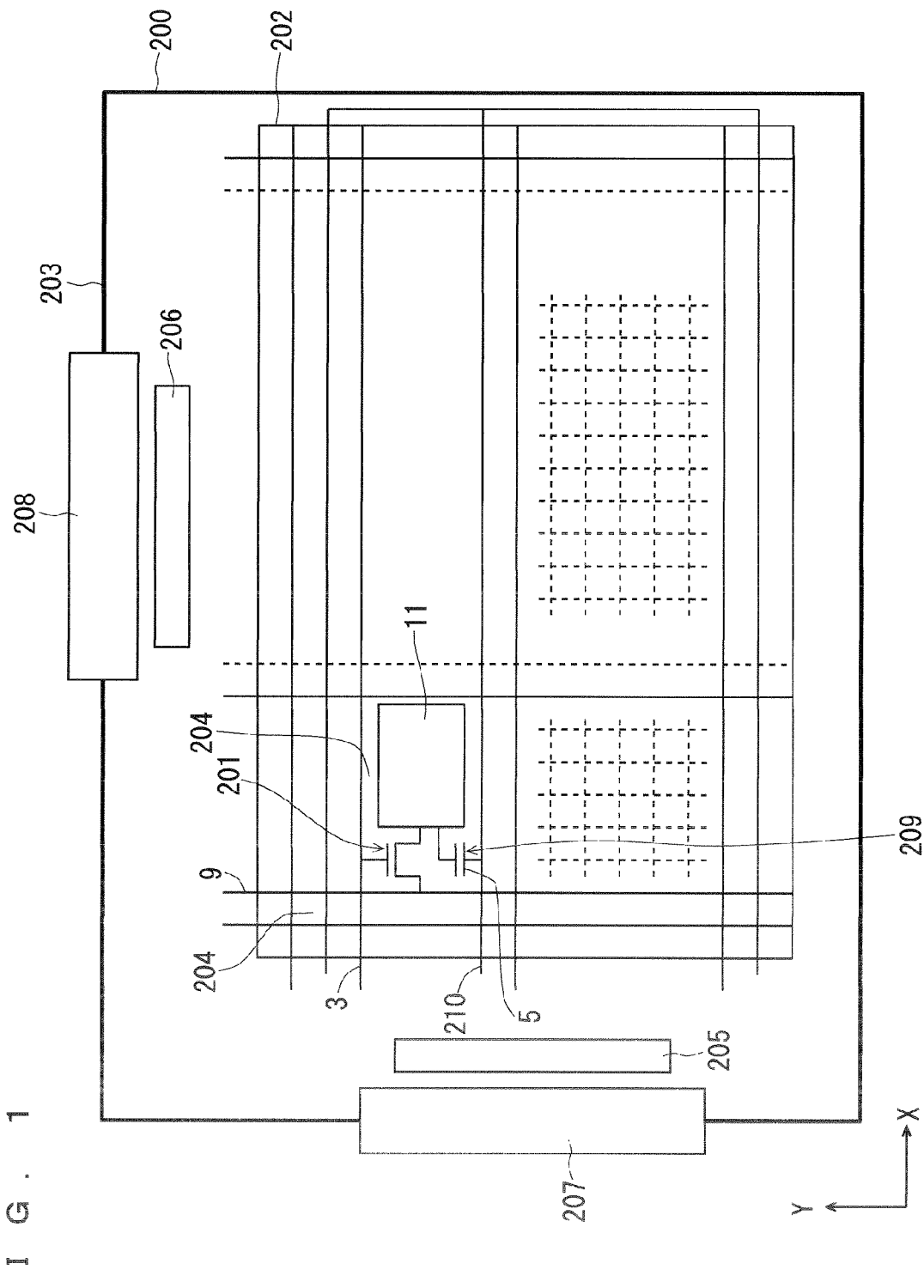
FIG. 1 is a plan view schematically illustrating an overall configuration of a TFT substrate.

First, the overall configuration of the TFT substrate is described with reference to FIG. 1. FIG. 1 is a plan view schematically illustrating the overall configuration of the TFT substrate, where a TFT substrate for LCDs is described as an example.

A TFT substrate 200 shown in FIG. 1 is a TFT array substrate including TFTs 201 arranged in matrix, and is roughly divided into a display area 202 and a frame area 203 provided so as to surround the display area 202.

In the display area 202, a plurality of gate wires (scanning signal lines) 3, a plurality of auxiliary capacitance electrodes 5, and a plurality of source wires (display signal lines) 9 are provided. The plurality of gate wires 3 are disposed to be parallel with each other, and the plurality of source wires 9 are disposed in parallel with each other to perpendicularly intersect the plurality of gate wires 3. With reference to FIG. 1, the gate wires 3 are disposed to extend laterally (in an X direction), and the source wires 9 are disposed to extend longitudinally (in a Y direction).

An area surrounded by the adjacent gate wires 3 and the adjacent source wires 9 is a pixel 204. In the TFT substrate 200, the pixels 204 are arranged in matrix.

FIG. 1 shows a part of the pixels 204 such that the configuration thereof is enlarged, where at least one TFT 201 is disposed in the pixel 204. The TFT 201 is disposed in the vicinity of an intersection of the source wire 9 and a gate wire 3. The gate electrode of the TFT 201 is connected to the gate wire 3, the source electrode of the TFT 201 is connected to the source wire 9, and the drain of the TFT 201 is connected to a pixel electrode 11. Further, an auxiliary capacitor 209 is connected to the pixel electrode 11, and an auxiliary capacitance electrode 5 is connected to an auxiliary capacitance wire 210 provided in parallel with each of the plurality of gate wires 3.

The gate wires 3 and the auxiliary capacitance wires 210 are alternately disposed, and the auxiliary capacitance wires 210 and the source wires 9 are disposed to perpendicularly intersect each other.

A scanning signal drive circuit 205 and a display signal drive circuit 206 are provided in the frame area 203 of the TFT substrate 200. The gate wire 3 extends from the display area 202 to the frame area 203 on the side on which the scanning signal drive circuit 205 is provided, and the gate wire 3 is connected to the scanning signal drive circuit 205 at the end portion of the TFT substrate 200.

Similarly, the source wire 9 extends from the display area 202 to the frame area 203 on the side on which the display signal drive circuit 206 is provided, and the source wire 9 is connected to the display signal drive circuit 206 at the end portion of the TFT substrate 200.

A connection substrate 207 for connection with the outside is disposed in the vicinity of the scanning signal drive circuit 205, and a connection substrate 208 for connection with the outside is disposed in the vicinity of the display signal drive circuit 206. The connection substrates 207 and 208 are, for example, wiring substrates such as flexible printed circuit (FPC).

Various signals are supplied from the outside to the scanning signal drive circuit 205 and the display signal drive circuit 206 through the connection substrates 207 and 208, respectively. The scanning signal drive circuit 205 supplies a gate signal (scanning signal) to the gate wire 3 based on a control signal from the outside. The gate wires 3 are sequentially selected in response to the gate signal. The display signal drive circuit 206 supplies a display signal to the source wire 9 based on a control signal from the outside and display data. This enables to supply a display voltage corresponding to the display data to each pixel 204.

The scanning signal drive circuit 205 and the display signal drive circuit 206 are not limited to the configuration in which they are arranged on the TFT substrate 200. For example, a drive circuit may be formed of a tape carrier package (TCP) and be arranged in a portion different from the TFT substrate 200.

The auxiliary capacitance electrode 5 is configured to overlap (superimpose) the pixel electrode 11 in plan view, as described below with reference to a plan view, and forms the auxiliary capacitor 209 with the pixel electrode 11 being one electrode and the auxiliary capacitance electrode 5 being the other electrode. The auxiliary capacitance electrode 5 in each pixel 204 is connected to the auxiliary capacitance wire 210 to be bound. For example, the auxiliary capacitance electrode 5 is supplied with a common potential from the scanning signal drive circuit 205 or the display signal drive circuit 206.

The TFT 201 functions as a switching element for supplying a display voltage to the pixel electrode 11, and the TFT 201 is controlled to turn on and off by a gate signal received from the gate electrode. Then, a predetermined voltage is applied to the gate electrode and the TFT 201 turns on, whereby a current flows from the source wire 9. As a result, a display voltage is applied from the source wire 9 to the pixel electrode 11 connected to the drain electrode of the TFT 201, and an electric field corresponding to the display voltage is generated between the pixel electrode 11 and a counter electrode (not shown). A liquid crystal capacitor (not shown) is formed of liquid crystals between the pixel electrode 11 and the counter electrode in parallel with the auxiliary capacitor 209. Note that in a case of an in-plane switching (IPS) type liquid crystal display device, a counter electrode is disposed on the TFT substrate 200 side.

The liquid crystal capacitor and the auxiliary capacitor 209 keep the display voltage applied to the pixel electrode 11 for a certain period. An alignment film (not shown) may be formed on the surface of the TFT substrate 200.

A counter substrate (not shown) is disposed on the TFT substrate 200. The counter substrate is, for example, a color filter substrate and is disposed on a viewing side. A color filter, black matrix (BM), counter electrode, alignment film, and the like are formed on the counter substrate.

The TFT substrate 200 and the counter substrate are bonded with a predetermined gap (cell gap) therebetween. Then, liquid crystals are injected to and sealed in this gap. That is, a liquid crystal layer is sandwiched between the TFT substrate 200 and the counter substrate. Further, a polarizing plate, a phase difference plate, and the like are provided on the outer surfaces of the TFT substrate 200 and the counter substrate. Also, a backlight unit and the like are disposed on the side opposite to the viewing side of the liquid crystal display panel configured as described above. The TFT substrate 200 is arranged on the side opposite to the viewing side, and the counter substrate is arranged on the viewing side. Accordingly, the backlight unit is arranged outside the TFT substrate 200.

<Operation of Liquid Crystal Display Device>

Liquid crystals are driven by the electric field between the pixel electrode 11 and the counter electrode. That is, the alignment direction of liquid crystals between the substrates changes. This changes the polarization state of the light passing through the liquid crystal layer. The light that has passed through the polarizing plate and turned into linearly polarized light changes its polarization state by the liquid crystal layer.

Specifically, the light from the backlight unit turns into linearly polarized light by the polarizing plate on the TFT substrate 200 side. Then, the linearly polarized light passes through the liquid crystal layer, and changes its polarization state.

Accordingly, an amount of the light that passes through the polarizing plate on the counter substrate side changes depending on the polarization state. That is, of the transmitted light that passes through the liquid crystal display panel from the backlight unit, an amount of the light that passes through the polarizing plate on the viewing side changes. The alignment direction of crystal liquids changes depending on a display voltage to be applied. Therefore, an amount of the light that passes through the polarizing plate on the viewing side can be changed by controlling a display voltage. That is, a desired image can be displayed on the liquid crystal display device by changing a display voltage per pixel.

<Pixel Configuration of TFT Substrate>

Figure 2:
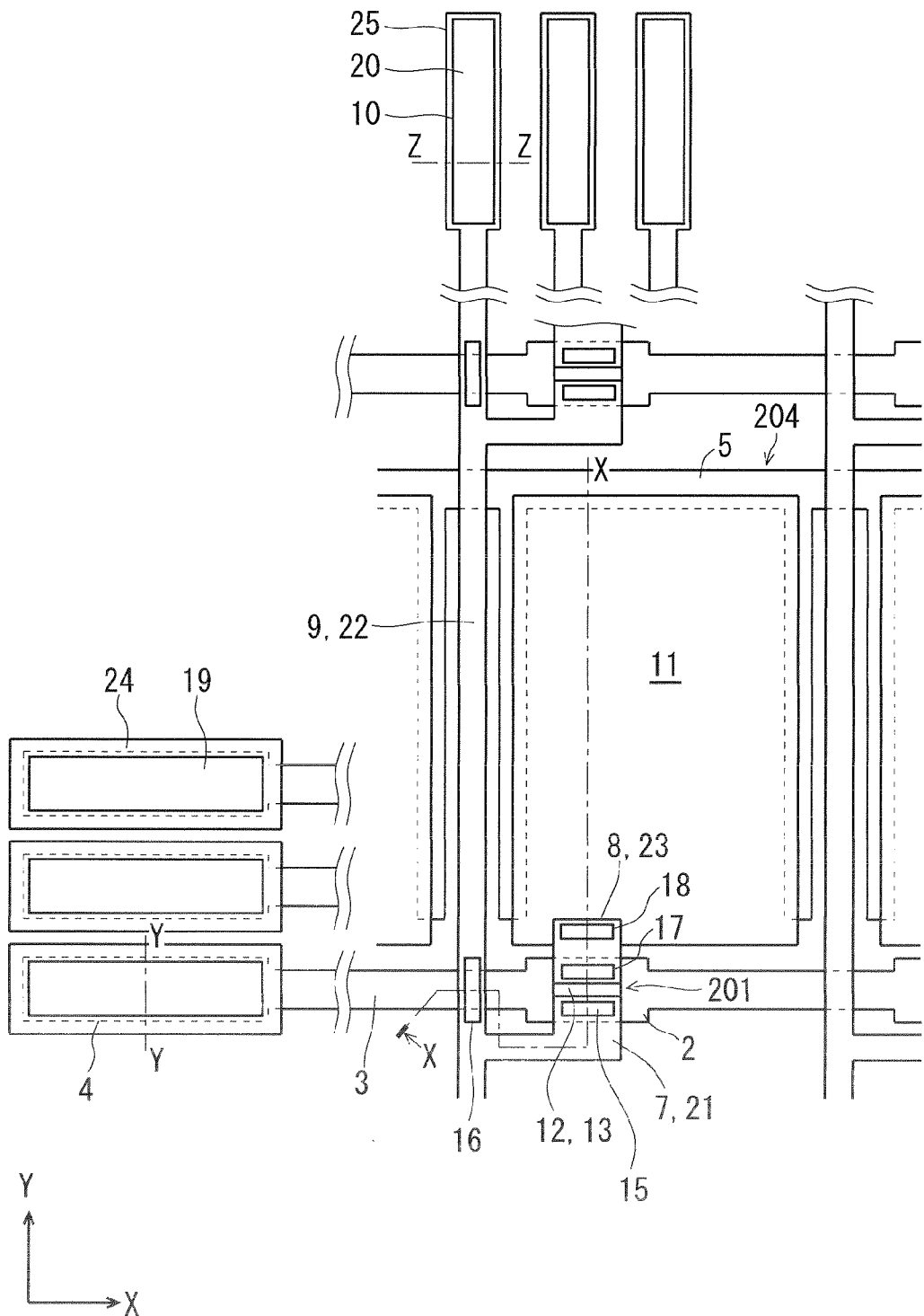
FIG. 2 is a view showing a planar configuration of a pixel of a TFT substrate according to a first preferred embodiment of the present invention.
Figure 3:
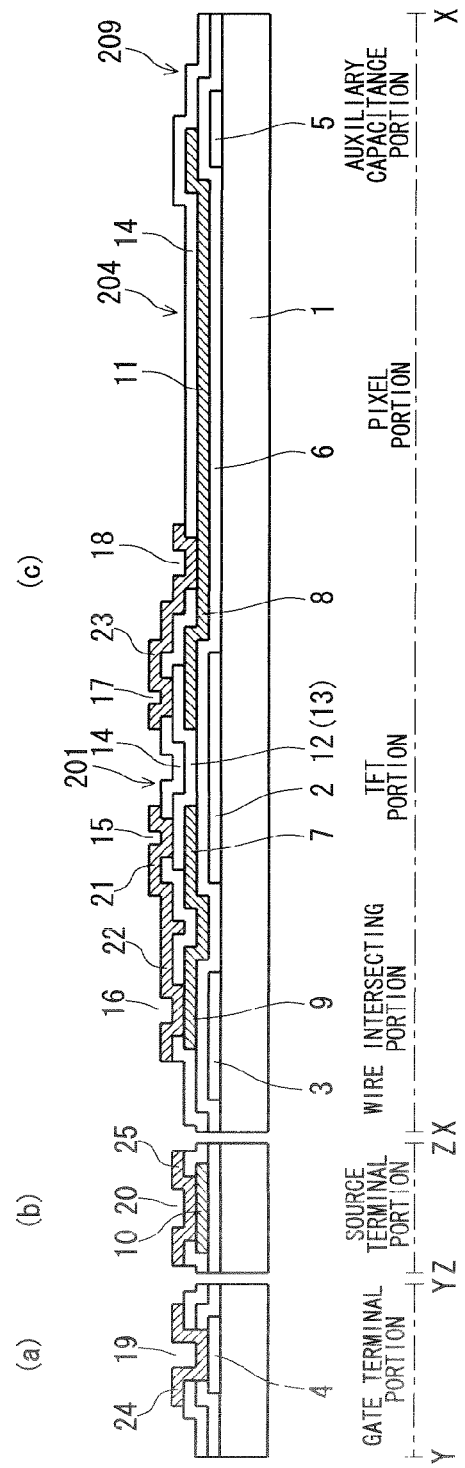
FIG. 3 is a view showing the cross-sectional configuration of the pixel of the TFT substrate according to the first preferred embodiment of the present invention.

Next, the configuration of the TFT substrate according to the first preferred embodiment is described with reference to FIGS. 2 and 3. While the present invention relates to a TFT substrate, it has characteristics particularly in pixel configuration. For this reason, the pixel configuration is described below. FIG. 2 is a plan view showing a planar configuration of the pixel 204 according to the first preferred embodiment. FIG. 3 is a cross-sectional view showing the cross-sectional configuration (cross-sectional configuration of a pixel portion and a TFT portion) at the line X-X in FIG. 2, the cross-sectional configuration (cross-sectional configuration of a gate terminal portion) at the line Y-Y in FIG. 2, and the cross-sectional configuration (cross-sectional configuration of a source terminal portion) at the line Z-Z in FIG. 2 by portion (c), portion (a), and portion (b), respectively. Description is given below assuming that the TFT substrate 200 is used in a transmissive liquid crystal display device.

As shown in FIG. 3, for example, the TFT substrate is formed on a substrate 1 being a transparent insulating substrate such as glass, and the same conductive film is selectively disposed on the substrate 1 to form wires and electrodes. That is, a gate terminal 4 is disposed in the gate terminal portion shown in the portion (a) of FIG. 3. Besides, the gate wire 3 is disposed in the wire intersecting portion shown in the portion (c) of FIG. 3, a gate electrode 2 is disposed in the TFT portion shown therein, and the auxiliary capacitance electrode 5 is disposed in the auxiliary capacitance portion shown therein. The insulating film 6 is disposed so as to cover the gate terminal 4, the gate wire 3, the gate electrode 2, and the auxiliary capacitance electrode 5. The insulating film 6 functions as a gate insulating film in the TFT portion and thus may also be referred to as gate insulating film 6.

The same conductive film is selectively formed on the gate insulating film 6 to form wires and electrodes. That is, in the TFT portion shown in the portion (c) of FIG. 3, the source electrode 7 and drain electrode 8 formed of a conductive film are disposed to be spaced from each other on the gate insulating film 6, the semiconductor film 12 is disposed so as to straddle the source electrode 7 and the drain electrode 8, and a channel portion 13 is formed in the surface of the semiconductor film 12 provided on the gate insulating film 6 between the source electrode 7 and the drain electrode 8.

The semiconductor film 12 is formed of, for example, an oxide-based semiconductor film. The use of an oxide-based semiconductor film for a channel layer achieves higher mobility than that of amorphous silicon. Specifically, zinc oxide (ZnO) films and InGaZnO films obtained by adding a gallium oxide ($Ga_2O_3$) and an indium oxide ($In_2O_3$) to a zinc oxide (ZnO) can be used as the oxide-based semiconductor film.

The drain electrode 8 extends, as the pixel electrode 11, up to above the auxiliary capacitance electrode 5 of the auxiliary capacitance portion in the pixel electrode portion.

In the source terminal portion shown in the portion (b) of FIG. 3, a source terminal 10 formed of a conductive film is disposed on the gate insulating film 6.

A protective insulating film 14 is formed so as to entirely cover the substrate 1 and covers the semiconductor film 12, the source electrode 7, the drain electrode 8, the pixel electrode 11, and the source terminal 10.

A plurality of contact holes are formed in the protective insulating film 14. That is, as shown in the portion (c) of FIG. 3, contact holes 15 and 17 are formed to pass through the protective insulating film 14 and reach the semiconductor film 12. The contact holes 15 and 17 reach the semiconductor film 12 on the source electrode 7 and the semiconductor film 12 on the drain electrode 8, and thus referred to as source-electrode-portion contact hole 15 and drain-electrode-portion contact hole 17, respectively.

A contact hole 16 is formed so as to pass through the protective insulating film 14 and reach the source wire 9, which is referred to as source-wire-portion contact hole 16. A contact hole 18 is formed so as to pass through the protective insulating film 14 and reach the drain electrode 8, which is referred to as pixel-drain contact hole 18.

An upper-layer source electrode 21 and an upper-layer source wire 22 are disposed. The upper-layer source electrode 21 is in contact with and is electrically connected to the surface of the semiconductor film 12 formed therebelow, through the source-electrode-portion contact hole 15. The upper-layer source wire 22 is in contact with and is electrically connected to the surface of the source wire 9 formed therebelow, through the source-wire-portion contact hole 16.

The upper-layer source electrode 21 and the upper-layer source wire 22 are integrally formed, and the source electrode 7 is electrically connected to the upper-layer source electrode 21 via the source wire 9.

An upper-layer drain electrode 23 is disposed, which is in contact with and is electrically connected to the surface of the semiconductor film 12 formed therebelow, through the drain-electrode-portion contact hole 17. The upper-layer drain electrode 23 is in contact with and is electrically connected to the surface of the drain electrode 8 formed therebelow, through the pixel-drain contact hole 18. Thus, the upper-layer drain electrode 23 is configured to electrically connect the drain electrode 8, the semiconductor film 12, and the pixel electrode 11.

As shown in the portion (a) of FIG. 3, a contact hole 19 is formed so as to pass through the protective insulating film 14 and the gate insulating film 6 and reach the gate terminal 4, which is referred to as gate-terminal-portion contact hole 19. A gate terminal pad 24 is disposed, which is in contact with and is electrically connected to the surface of the gate terminal 4 formed therebelow, through the gate-terminal-portion contact hole 19.

As shown in the portion (b) of FIG. 3, a contact hole 20 is formed so as to pass through the protective insulating film 14 and reach the source terminal 10, which is referred to as source-terminal-portion contact hole 20. A source terminal pad 25 is disposed, which is in contact with and is electrically connected to the surface of the source terminal 10 formed therebelow, through the source-terminal-portion contact hole 20.

Next, the planar configuration of the pixel 204 is described. As shown in FIG. 2, a plurality of gate wires 3 are provided in parallel with each other to extend laterally (in X direction) so as to be perpendicular to a plurality of source wires 9. The gate wires 3 are formed to be integrated with the gate electrode 2 of the TFT 201. That is, the gate wire 3 in the TFT 201 portion serves as the gate electrode 2. The gate electrode 2 is configured to be wider than the gate wire 3.

The source electrode 7 and the drain electrode 8 are provided on the gate electrode 2 via the gate insulating film 6 (FIG. 3). The source electrode 7 and the drain electrode 8 are disposed to be spaced from and be opposed to each other above the gate electrode 2 of the TFT 201. The semiconductor film 12 between the source electrode 7 and the drain electrode 8 forms the channel portion 13 of the TFT 201.

One end of the gate wire 3 is connected to the gate terminal 4. The gate terminal pad 24 is disposed above the gate terminal 4 to be electrically connected to the gate wire 3 through the gate-terminal-portion contact hole 19.

The scanning signal drive circuit 205 (FIG. 1) is connected to the gate terminal 4 such that a scanning signal is supplied to the gate wire 3.

The source wire 9 is provided to extend longitudinally (in the Y direction), and the source electrode 7 branches toward the X direction from somewhere in the middle of the source wire 9 and extends to overlap the portion above the gate electrode 2. The upper-layer source wire 22 is disposed above the source wire 9 such that they overlap each other, and the upper-layer source electrode 21 is disposed above the source electrode 7 such that they overlap each other.

One end of the source wire 9 is connected to the source terminal 10. The source terminal pad 25 is disposed above the source terminal 10 and is electrically connected to the source wire 22 through the source-terminal-portion contact hole 20.

The display signal drive circuit 206 (FIG. 1) is connected to the source terminal pad 25 such that an image display signal is supplied to the source wire 9.

The pixel electrode 11 is formed to extend from the drain electrode 8, and a part of the pixel electrode 11 overlaps a part of the auxiliary capacitance electrode 5 via the gate insulating film 6. In this region, the auxiliary capacitor 209 for the pixel electrode is formed. The TFT substrate 200 is used in a transmissive liquid crystal display device, and thus, the pixel electrode 11 is formed of a light-transmitting conductive film.

The auxiliary capacitance electrode 5 is disposed in a portion corresponding to the edge portion of a pixel area so as to have a square U-shape in plan view. The auxiliary capacitance electrode 5 is not limited to a square U-shape but may be straight or may be L-shaped as long as a desired auxiliary capacitance is obtained.

<Manufacturing Method>

Next, a method of manufacturing the TFT substrate according to the first preferred embodiment is described with reference to FIGS. 4 to 8. The cross-sectional view showing the last step corresponds to FIG. 3, and the portions (a) to (c) of FIG. 3 respectively represent the same portions in the cross-sectional views illustrating the manufacturing steps in the description below.

First, the substrate 1 is cleaned with a cleaning fluid or pure water. Here, a glass substrate having a thickness of 0.5 mm is used as the substrate 1. Then, a first conductive film (not shown) is deposited entirely on one main surface of the cleaned substrate 1.

Here, for example, chrome (Cr), molybdenum (Mo), titanium (Ti), copper (Cu), tantalum (Ta), tungsten (W), aluminum (Al), and alloys thereof obtained by adding trace amounts of other elements thereto can be used for the first conductive film. Alternatively, the first conductive film may have a laminated structure obtained by forming two or more layers of the metals and alloys thereof. The use of the metals and alloys thereof enables to obtain a low-resistance film having a resistivity value of 50 μΩcm or less.

Figure 4:
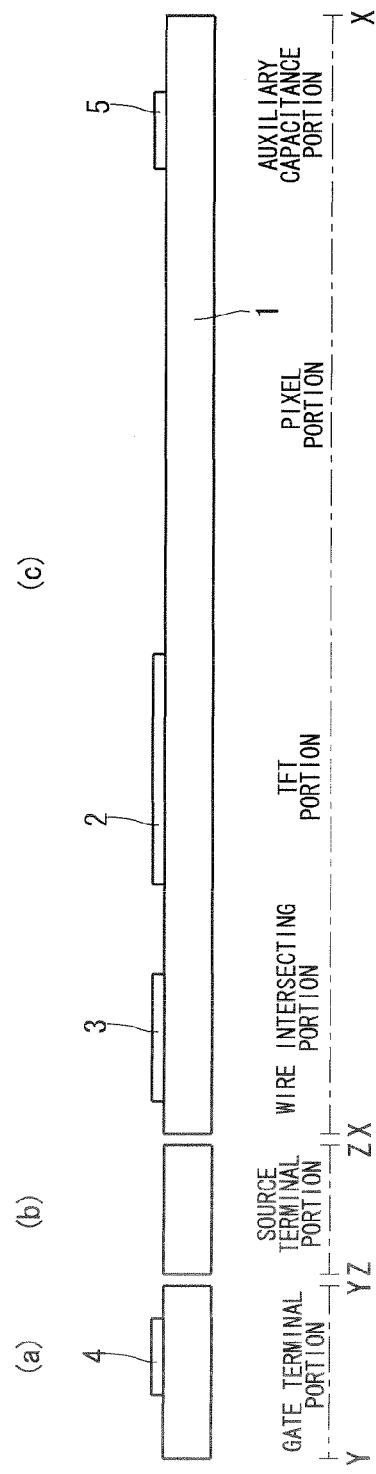
FIGS. 4 to 8 are cross-sectional views each showing the step of manufacturing the TFT substrate according to the first preferred embodiment of the present invention.

In the first preferred embodiment, a Mo film is used as the first conductive film, and the Mo film is deposited to have a thickness of 200 nm by a well-known sputtering process with an Ar gas. After that, a resist material is applied onto the Mo film, and a photoresist pattern is formed through a photolithographic step (first time). Then, the Mo film is patterned by etching with the photoresist pattern being an etching mask, and the photoresist pattern is removed. As a result, as shown in FIG. 4, the gate terminal 4, gate wire 3, gate electrode 2, and auxiliary capacitance electrode 5 are formed on the substrate 1.

In this etching step, well-known wet etching with a solution containing phosphoric acid, nitric acid, and acetic acid can be used.

Figure 5:
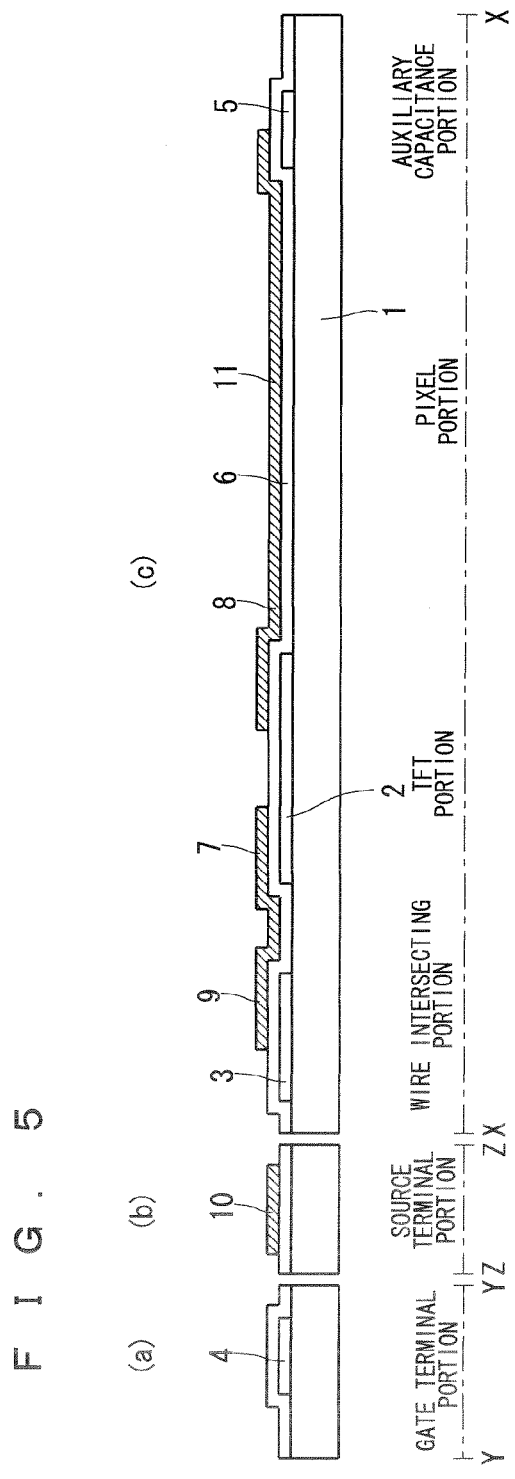

Next, in the step shown in FIG. 5, the gate insulating film 6 is deposited entirely on one main surface of the substrate 1 to cover the gate terminal 4, gate wire 3, gate electrode 2, and auxiliary capacitance electrode 5. After that, a second conductive film (not shown) is deposited on the gate insulating film 6.

The gate insulating film 6 can be obtained by forming a silicon oxide (SiO) film by a chemical vapor deposition (CVD) process. Here, a silicon oxide film having a thickness of 300 nm is deposited under a substrate heating condition of approximately 300° C. The silicon oxide film has weak barrier properties against moisture ($H_2O$), hydrogen ($H_2$), or impurity elements that affect TFT characteristics, such as sodium (Na) and potassium (K), and thus may have a laminated structure in which, for example, a silicon nitride (SiN) film having excellent barrier properties or the like is provided below the silicon oxide film.

As a second conductive film, a light-transmitting conductive film is deposited. As the light-transmitting conductive film, an ITO film (mixing ratio of an indium oxide $In_2O_3$ and a tin oxide $SnO_2$ is, for example, 90:10 wt. %) being a conductive oxide is used in the first preferred embodiment. An ITO film generally has a stable crystalline (polycrystalline) structure at a room temperature. Here, the ITO film is deposited with a gas obtained by mixing a gas containing hydrogen (H), for example, a hydrogen ($H_2$) gas or vapor ($H_2O$) into argon (Ar) through a well-known sputtering process, so that an ITO film having a thickness of 100 nm is formed in an amorphous state.

After that, a resist material is applied onto the ITO film, and a photoresist pattern is formed through the photolithographic step (second time). Then, the ITO film is patterned by etching with the photoresist pattern being an etching mask, and the photoresist pattern is removed. As a result, as shown in FIG. 5, the source terminal 10, source wire 9, source electrode 7, drain electrode 8, and pixel electrode 11 are formed on the gate insulating film 6.

In this etching step, well-known wet etching with an oxalic-acid-based solution can be used.

The reason why a light-transmitting conductive film is used as the second conductive film is that in a case of a liquid crystal display device that performs display through transmission of back light, the formation of a light-transmitting pixel electrode is required.

After that, the substrate 1 is heat-treated at a temperature of 200° C. further. As a result of the heat treatment, the ITO film in an amorphous state is crystallized and changes into a polycrystalline ITO film. The ITO film in a polycrystalline state shows excellent chemical stability, and thus does not dissolve in typical etching solutions (containing oxalic acid) other than aqua regia (hydrochloric acid+nitric acid)-based etching solutions. This enables to secure etching selectivity with a metal film to be formed thereabove. The heat-treatment temperature in crystallization of an amorphous ITO film needs to be set at least higher than the temperature (crystallization temperature) at which crystallization begins. The crystallization temperature of an amorphous ITO film having a typical composition is approximately 150° C., and thus, the heat-treatment temperature is desirably 150° C. or higher.

Figure 6:
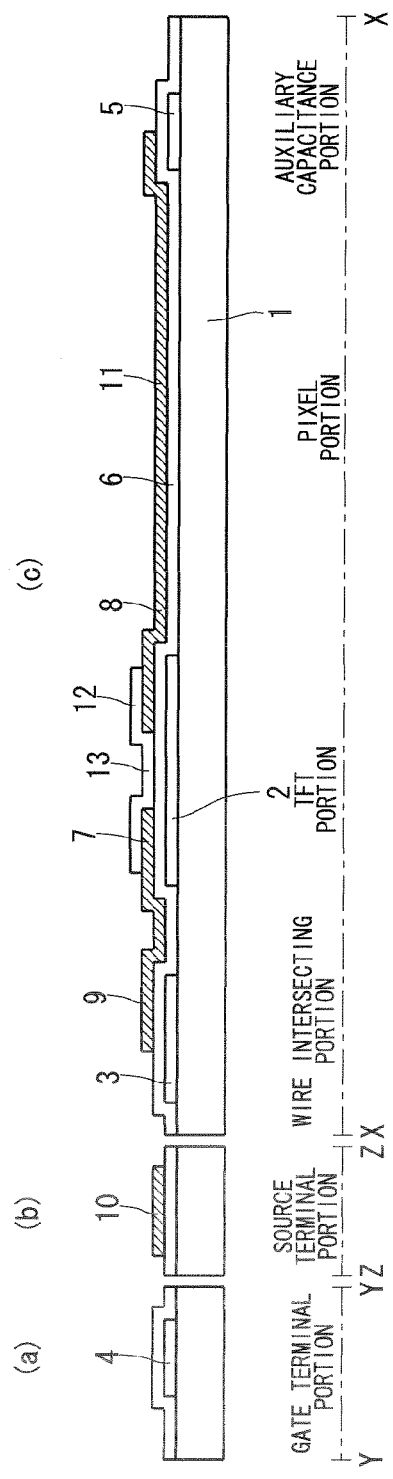

Next, in the step shown in FIG. 6, the semiconductor film 12 is formed so as to straddle the source electrode 7 and the drain electrode 8.

In the formation of the semiconductor film 12, first, an oxide-based semiconductor film (InGaZnO film) containing In, Ga, and Zn is formed entirely on one main surface of the substrate 1. The oxide-based semiconductor film is deposited by the sputtering process using an InGaZnO target, and here, is deposited by the sputtering process with an Ar gas using an InGaZnO target where an atomic composition ratio of In:Ga:Zn:O is 1:1:1:4. In this case, an atomic composition ratio of oxygen is normally smaller than that of the stoichiometric composition, resulting in an oxide film in an oxygen and ion deficient state (in the example above, the composition ratio of O is less than four). Therefore, it is desirable to perform sputtering with an Ar gas mixed with an oxygen ($O_2$) gas.

In the first preferred embodiment, sputtering is performed with a mixed gas obtained by adding, at a division ratio, a 10% of $O_2$ gas to an Ar gas, and an InGaZnO film is deposited to have a thickness of 50 nm. The InGaZnO film is deposited to have an amorphous structure. The crystallization temperature of the InGaZnO film having an amorphous structure is typically 500° C. or higher, and most of the film is stable while having an amorphous structure at a room temperature.

After that, a resist material is applied onto the InGaZnO film, and a photoresist pattern is formed through the photolithographic step (third time). Then, the InGaZnO film is patterned by etching with the photoresist pattern being an etching mask, and the photoresist pattern is removed. As a result, as shown in FIG. 6, the semiconductor film 12 that straddles the source electrode 7 and the drain electrode 8 is obtained.

In the step of etching the InGaZnO film, well-known wet etching with an oxalic-acid-based solution can be used.

On this occasion, the ITO film has been polycrystallized, and thus, the source electrode 7, drain electrode 8, source wire 9, source terminal 10, and pixel electrode 11 that have been formed in the preceding steps are not etched with an oxalic-acid-based solution. Therefore, the pattern does not disappear.

Further, the InGaZnO-based semiconductor film and ITO-based conductive film of the same oxide are brought into contact to be electrically connected. This enables to prevent an interface reaction (redox reaction) therebetween. Accordingly, the contact resistance (interface resistance) in the interface portion between the semiconductor film 12 and each of the source electrode 7 and drain electrode 8 in the TFT 201 can be kept low, leading to an effect that the on-current and mobility are increased to improve TFT characteristics.

Figure 7:
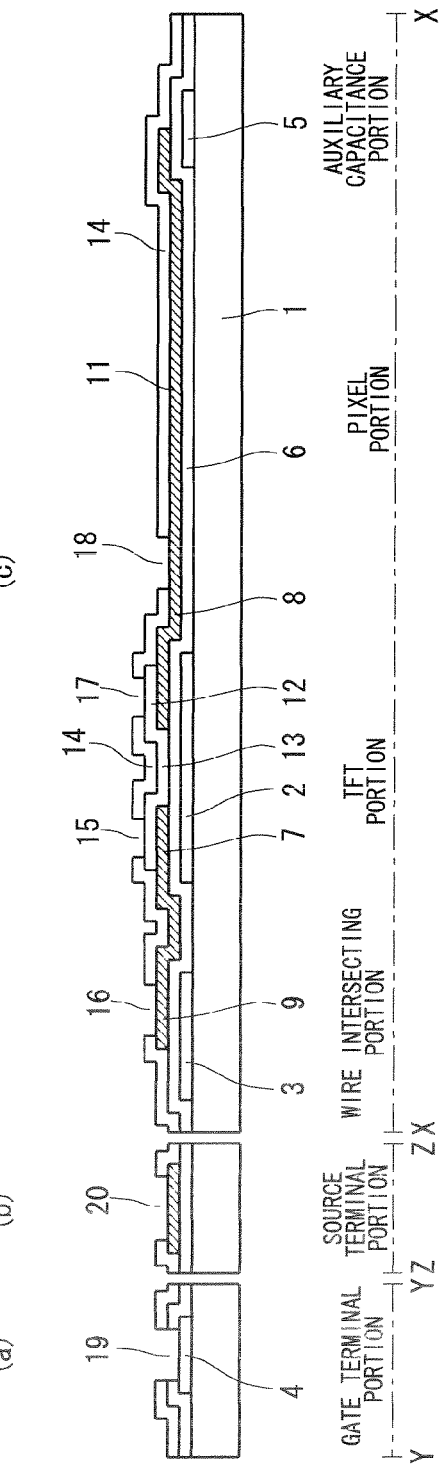

Next, in the step shown in FIG. 7, the protective insulating film 14 is deposited entirely on one main surface of the substrate 1, and then, a contact hole passing through the protective insulating film 14 and the gate insulating film 6 is formed.

The protective insulating film 14 can be obtained by forming a silicon oxide (SiO) film having a thickness of 300 nm under the substrate heating condition at approximately 250° C. by the CVD process.

After that, a resist material is applied onto the silicon oxide film, and a photoresist pattern is formed through the photolithographic step (fourth time). Then, the silicon oxide film is etched with the photoresist pattern being an etching mask.

In this etching step, a well-known dry etching process using a fluorine-based gas can be used. Through this step, the source-electrode-portion contact hole 15, source-wire-portion contact hole 16, drain-electrode-portion contact hole 17, pixel-drain contact hole 18, and source-terminal-portion contact hole 20 passing through the protective insulating film 14 are formed, and the gate-terminal-portion contact hole 19 passing through the protective insulating film 14 and the gate insulating film 6 can be formed at the same time.

The source-electrode-portion contact hole 15 and the drain-electrode-portion contact hole 17 are provided to reach the surface of the semiconductor film 12 above the source electrode 7 and the drain electrode 8, respectively. The source-wire-portion contact hole 16 is provided to reach the surface of the source wire 9, and the pixel-drain contact hole 18 is provided to reach the surface of the drain electrode 8. The gate-terminal-portion contact hole 19 and the source-terminal-portion contact hole 20 are provided to reach the surfaces of the gate terminal 4 and the source terminal 10, respectively.

Figure 8:
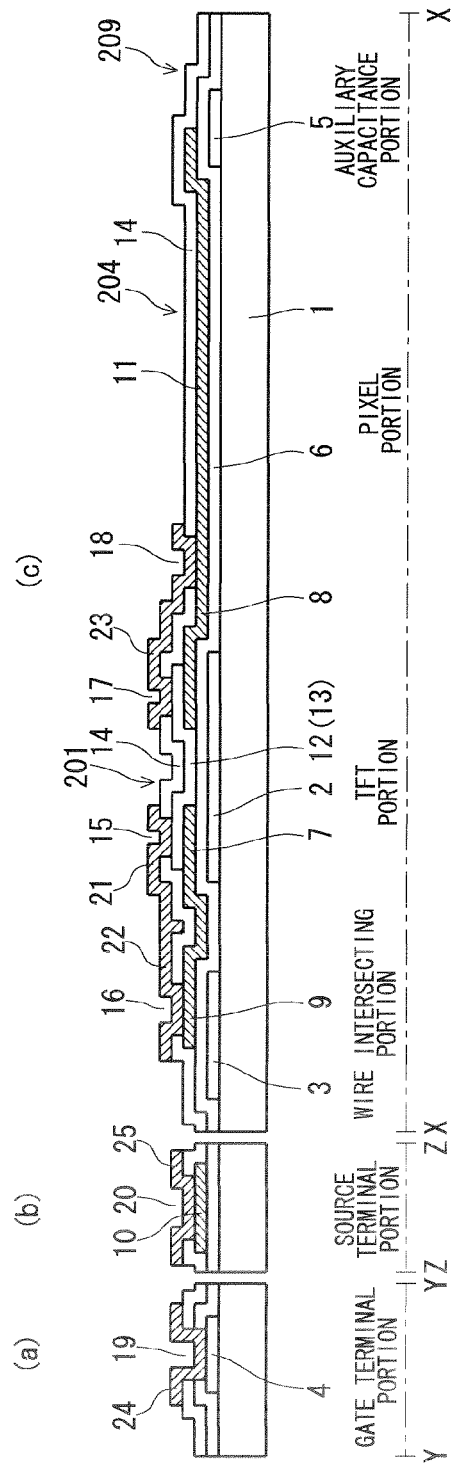

Next, in the step shown in FIG. 8, the upper-layer source electrode 21, upper-layer source wire 22, upper-layer drain electrode 23, gate terminal pad 24, and source terminal pad 25 are formed.

In the formation of them, first, a third conductive film (not shown) is formed entirely on one main surface of the substrate 1.

For example, Cr, Mo, Ti, Cu, Ta, W, Al, and alloys thereof obtained by adding trace amounts of other elements thereto can be used as the third conductive film. Alternatively, the third conductive film may have a laminated structure obtained by forming two or more layers of the metals and alloys thereof. The use of the metals and alloys thereof enables to obtain a low-resistance film having a resistivity value of 50 µΩcm or less.

In the first preferred embodiment, a Mo film is used as the third conductive film, and the Mo film is deposited to have a thickness of 200 nm by a well-known sputtering process with an Ar gas. After that, a resist material is applied onto the Mo film, and a photoresist pattern is formed through the photolithographic step (fifth time). Then, the Mo film is patterned by etching with the photoresist pattern being an etching mask, and the photoresist pattern is removed. As a result, as shown in FIG. 8, the upper-layer source electrode 21, upper-layer source wire 22, upper-layer drain electrode 23, gate terminal pad 24, and source terminal pad 25 are formed.

In this etching step, well-known wet etching with a solution containing phosphoric acid, nitric acid, and acetic acid can be used.

The upper-layer source wire 22 is in contact with and is electrically connected to the surface of the source wire 9 formed therebelow, through the source-wire-portion contact hole 16.

The upper-layer source wire 22 and the upper-layer source electrode 21 are integrally formed, and the upper-layer source electrode 21 is in contact with and is electrically connected to the surface of the semiconductor film 12 on the source electrode 7 formed therebelow, through the source-electrode-portion contact hole 15. Accordingly, the upper-layer source electrode 21 and the upper-layer source wire 22 are configured to electrically connect the semiconductor film 12 and the source electrode 7 through the source-electrode-portion contact hole 15, the source-wire-portion contact hole 16, and the source wire 9.

The upper-layer drain electrode 23 is in contact with and is electrically connected to the surface of the semiconductor film 12 on the drain electrode 8 formed therebelow, through the drain-electrode-portion contact hole 17. Further, the upper-layer drain electrode 23 is in contact with and is electrically connected to the surface of the drain electrode 8 formed therebelow, through the pixel-drain contact hole 18. Therefore, the upper-layer drain electrode 23 is configured to electrically connect the semiconductor film 12, the drain electrode 8, and the pixel electrode 11 through the drain-electrode-portion contact hole 17 and the pixel-drain contact hole 18.

The gate-terminal-portion contact hole 19 and the source-terminal-portion contact hole 20 are formed for exposing the surfaces of the gate terminal 4 and the source terminal 10, respectively, where the gate terminal pad 24 and the source terminal pad 25 are formed, respectively.

The protective insulating film 14 covers the semiconductor film 12 formed therebelow, which enables selective etching without disappearance of the pattern in etching of the metal film. Through the above, the configuration shown in FIG. 8 is obtained, and the TFT substrate is completed.

Then, an alignment film and a spacer are formed on the surface of the completed TFT substrate. The alignment film is provided for arranging liquid crystals and is formed of, for example, polyimide. A counter substrate including a color filter and an alignment film is prepared, and the TFT substrate and the counter substrate are bonded together. Then, liquid crystals are injected into and held in a gap formed between the both substrates by the spacer. After that, a polarizing plate, a phase difference plate, a backlight unit, and the like are disposed outside the both substrates, to thereby obtain a liquid crystal display device (not shown).

<Effects>

As described above, in the method of manufacturing the TFT substrate according to the first preferred embodiment, a high-performance TFT substrate for a liquid crystal display device that includes an oxide semiconductor for a semiconductor active layer can be manufactured through five photolithographic steps.

In the first preferred embodiment, the semiconductor film 12 is formed after the formation of the source electrode 7 and the drain electrode 8. Accordingly, even in a case where an oxide-based semiconductor film having a low resistance to solution is used as the semiconductor film 12, the semiconductor film 12 can be processed through selective etching without being affected by etching of the source electrode 7, the drain electrode 8, and the like.

The source electrode 7 and the drain electrode 8 are each formed of an ITO film being a crystallized light-transmitting conductive film, and are brought into contact with the same oxide-based semiconductor film to be electrically connected thereto. Therefore, an interface reaction (redox reaction) therebetween can be prevented, and an interface resistance can be reduced.

The protective insulating film 14 is formed so as to cover the semiconductor film 12. The upper-layer source electrode 21 and the upper-layer drain electrode 23 to be electrically connected to the source electrode 7 and the drain electrode 8 that are formed therebelow, respectively, and to the semiconductor film 12 through the contact holes provided in the protective insulating film 14 are provided so as to be electrically connected to the source electrode and the drain electrode of the TFT 201 on the upper and lower surfaces of the semiconductor film 12. This increases the contact area between the semiconductor film 12 and each of the source electrode and the drain electrode, which enables to reduce an interface resistance further.

Even if the interface resistance of one of two interfaces between the source electrode 7 and the semiconductor film 12 and between the upper-layer source electrode 21 and the semiconductor film 12 is high, the other interface thereof can compensate for the high interface resistance. Also, even if the interface resistance of one of two interfaces between the drain electrode 8 and the semiconductor film 12 and between the upper-layer drain electrode 23 and the semiconductor film 12 is high, the other interface thereof can compensate for the high interface resistance. Accordingly, an interface resistance can be kept low and also the generation of defects due to poor TFT characteristics can be prevented.

Further, source wiring is formed of two layers including the source wire 9 and the upper-layer source wire 22 that is electrically connected to the source wire 9 through a plurality of source-wire-portion contact holes 16 provided at regular intervals in the protective insulating film 14. Therefore, even in a case where a poor pattern is generated in one source wire and the source wire is broken, the other source wire can compensate for the broken one, which enables to efficiently prevent an occurrence of defects due to breaking.

The upper-layer source wire 22 is formed of a metal film, which enables to reduce a resistance of a wire. This results in a configuration suitable for a display device required to have a lower resistance of a wire, such as a large display panel in which a wiring length is large and a high-definition panel in which a wiring width is small.

Even in a case where the upper-layer source wire 22 is formed of a metal film, the protective insulating film 14 covers the semiconductor film 12 formed therebelow. This prevents the semiconductor film 12 from disappearing by etching of the metal film and enables selective etching.

As described above, in the TFT substrate according to the first preferred embodiment, even in a case where an oxide semiconductor is used for a semiconductor active layer, the interface resistance between the semiconductor active layer and each of the source electrode and drain electrode can be kept low. Besides, an occurrence of defects due to a poor wring pattern can be prevented efficiently.

Besides, a TFT substrate whose operating speed is high and a display device including the same can be manufactured at high yield by achieving a TFT substrate including a high-mobility oxide-based semiconductor film. Accordingly, a high-performance TFT substrate and a liquid crystal display device can be manufactured with high productivity.

<Modification>

The first preferred embodiment has described that the TFT substrate 200 is used in a transmissive liquid crystal display device. Hereinafter, as a modification thereof, the configuration in a case where the TFT substrate 200 is used in a reflective-transmissive (hereinafter, referred to as semi-transmissive) liquid crystal display device including a pixel display portion that operates through light transmission and reflection is described with reference to FIGS. 9 and 10.

Figure 9:
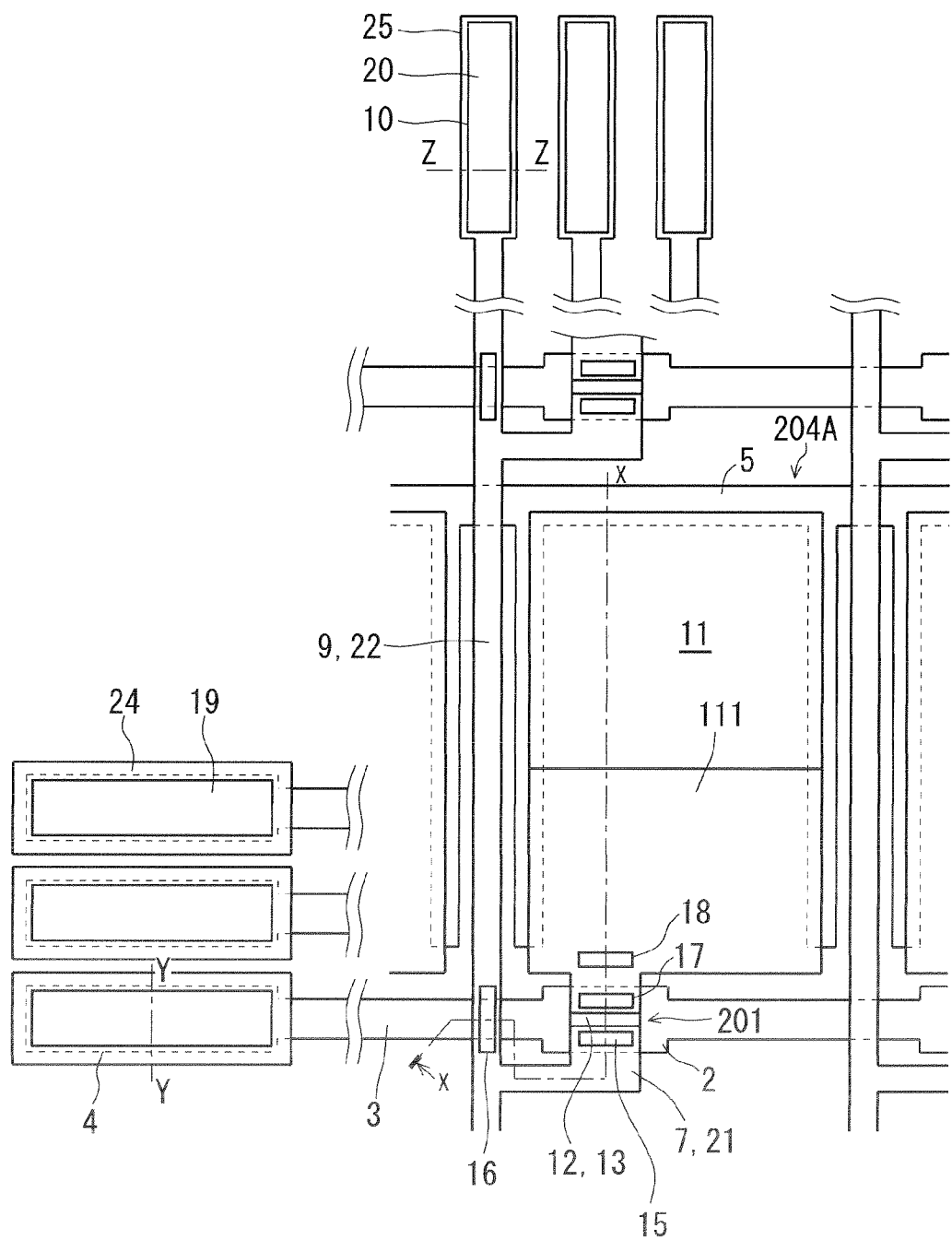
FIG. 9 is a view showing a planar configuration of a modification of the TFT substrate according to the first preferred embodiment of the present invention.
Figure 10:
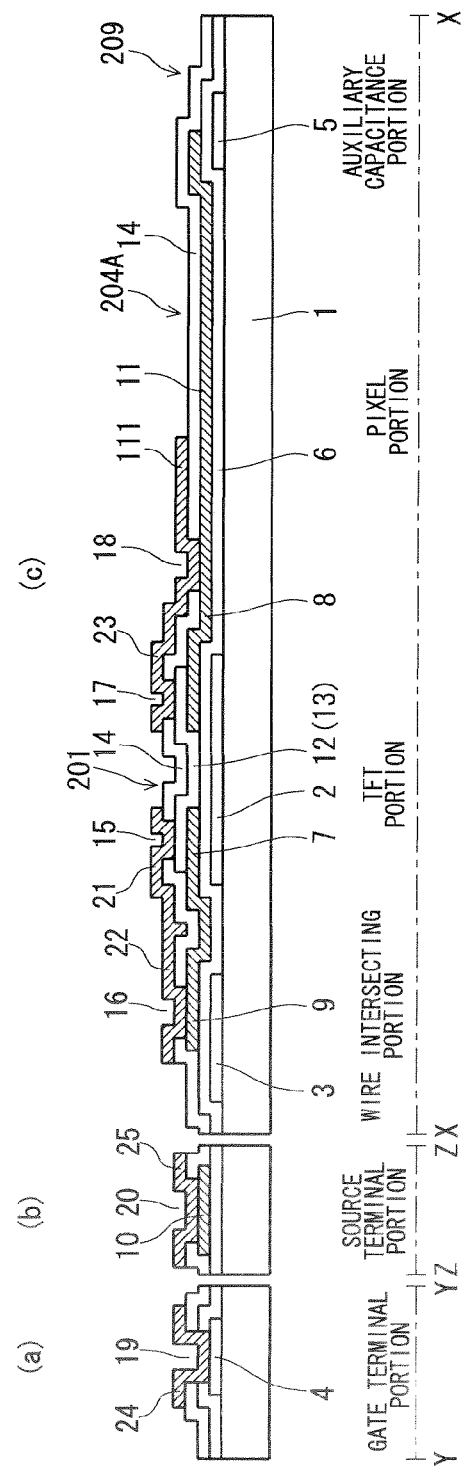
FIG. 10 is a view showing the cross-sectional configuration of the modification of the TFT substrate according to the first preferred embodiment of the present invention.

FIG. 9 is a plan view showing a planar configuration of a pixel 204A in a TFT substrate for use in a semi-transmissive liquid crystal display device. FIG. 10 is a cross-sectional view showing the cross-sectional configuration (cross-sectional configuration of a pixel portion and a TFT portion) at the line X-X in FIG. 9, the cross-sectional configuration (cross-sectional configuration of a gate terminal portion) at the line Y-Y in FIG. 9, and the cross-sectional configuration (cross-sectional configuration of a source terminal portion) at the line Z-Z in FIG. 9 by portion (a), portion (b), and portion (c), respectively. The same components as those of the pixel 204 shown in FIGS. 2 and 3 are denoted by the same reference symbols, and repetitive description is omitted.

As shown in FIGS. 9 and 10, the pixel 204A is configured such that the upper-layer pixel electrode 111 extends from the upper-layer drain electrode 23, above the pixel electrode 11 formed of a light-transmitting conductive film therebelow. A light reflecting surface (not shown) is formed of aluminum (Al) or silver (Ag) having high light reflectance and an alloy film containing the above as a main component as the surface (surface on the side opposite to the counter substrate) of the upper-layer pixel electrode 111, so that a TFT substrate suitable for a semi-transmissive liquid crystal display device including a pixel display portion that operates through light transmission and reflection can be manufactured.

The ratio between the transmissive display area and reflective display area of the pixel 204A can be appropriately changed by changing the area ratio of the upper-layer pixel electrode 111 extending from the upper-layer drain electrode 23. FIG. 9 shows an example in which the upper-layer pixel electrode 111 covers about 40% of the pixel electrode 11 formed therebelow. Through such formation that the upper-layer pixel electrode 111 entirely covers the pixel electrode 11 formed therebelow, a totally reflective liquid crystal display device can be obtained.

As described above, with the configuration in which the upper-layer pixel electrode 111 extends from the upper-layer drain electrode 23 above the pixel electrode 11 formed therebelow, a TFT substrate suitable for a semi-transmissive liquid crystal display device can be manufactured without adding a new photolithographic step.

<Second Preferred Embodiment>

A second preferred embodiment of the present invention is described with reference to FIGS. 11 to 20. The pixel 204 described in the first preferred embodiment adopts a structure (bottom gate structure) in which the gate electrode 2 is formed as the lowermost layer on the substrate 1. Meanwhile, a pixel 204B of the second preferred embodiment adopts a structure (top gate structure) in which the gate electrode 2 is formed as the uppermost layer.

<Configuration of Pixel of TFT Substrate>

Figure 11:
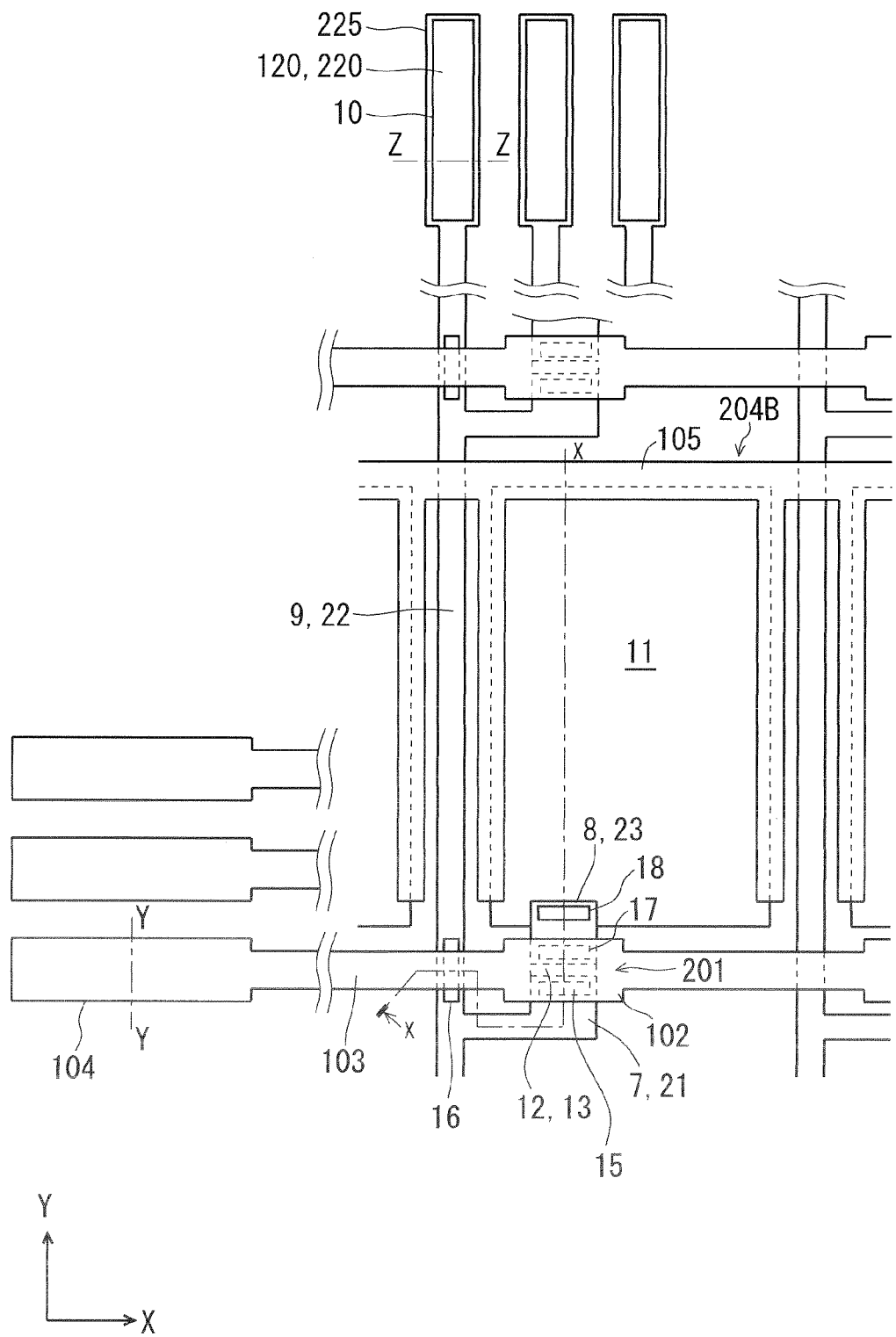
FIG. 11 is a view showing a planar configuration of a pixel of a TFT substrate according to a second preferred embodiment of the present invention.
Figure 12:
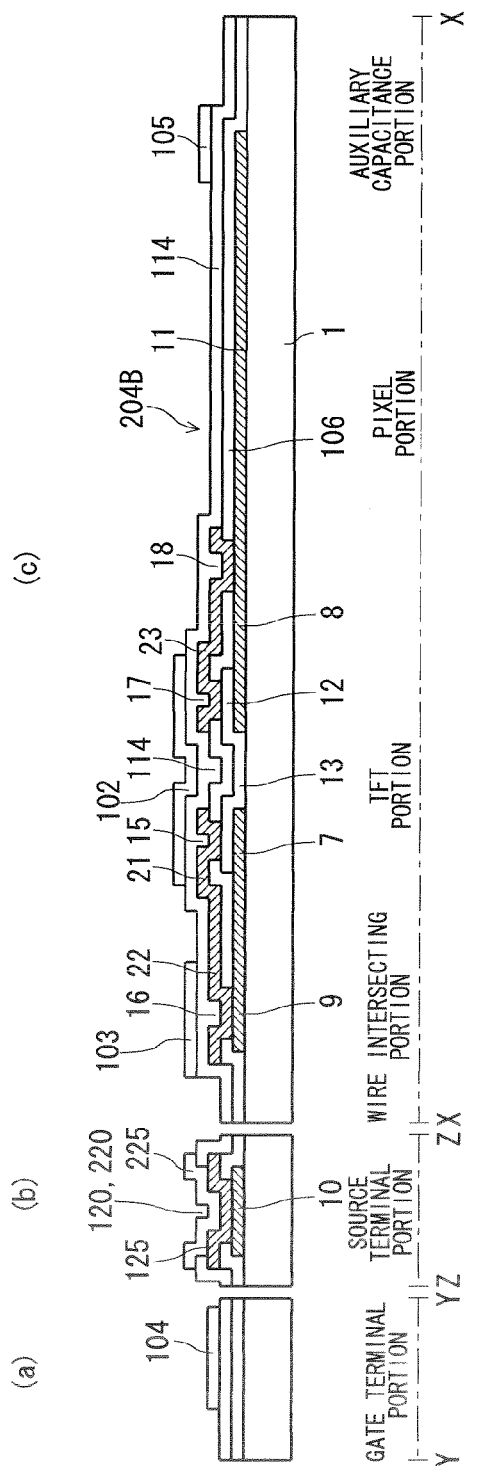
FIG. 12 is a view showing the cross-sectional configuration of the pixel of the TFT substrate according to the second preferred embodiment of the present invention.

Next, the configuration of the pixel 204B of the TFT substrate is described with reference to FIGS. 11 and 12. FIG. 11 is a plan view showing a planar configuration of the pixel 204B. FIG. 12 is a cross-sectional view showing the cross-sectional configuration (cross-sectional configuration of a pixel portion and a TFT portion) at the line X-X in FIG. 11, the cross-sectional configuration (cross-sectional configuration of a gate terminal portion) at the line Y-Y in FIG. 11, and the cross-sectional configuration (cross-sectional configuration of a source terminal portion) at the line Z-Z in FIG. 11 by portion (c), portion (a), and portion (b), respectively. The same components as those of the pixel 204 shown in FIGS. 2 and 3 are denoted by the same reference symbols, and repetitive description is omitted. Further, description is given below assuming that the TFT substrate 200 is used in a transmissive liquid crystal display device.

As shown in FIG. 12, the TFT substrate is formed on the substrate 1 being a transparent insulating substrate such as glass, and the same conductive film is selectively disposed on the substrate 1 to form wires and electrodes. That is, the source terminal 10 is disposed in the source terminal portion shown in the portion (b) of FIG. 12. The source wire 9 is disposed in the wire intersecting portion shown in the portion (c) of FIG. 12, the source electrode 7 and the drain electrode 8 are disposed to be spaced from each other and the semiconductor film 12 is disposed so as to straddle the source electrode 7 and the drain electrode 8 in the TFT portion shown therein, and the pixel electrode 11 is disposed and an insulating film 106 is disposed so as to entirely cover the substrate 1 in the pixel portion shown therein. The insulating film 106 functions as a gate insulating film in the TFT portion, and thus may be referred to as first gate insulating film 106.

The semiconductor film 12 is electrically connected to the source electrode 7 and the drain electrode 8 with parts of the bottom surface thereof being in contact with parts of the surfaces of the source electrode 7 and the drain electrode 8. A channel portion 13 is formed in the surface of the semiconductor film 12 provided between the source electrode 7 and the drain electrode 8.

The semiconductor film 12 is, for example, an oxide-based semiconductor film. The use of the oxide-based semiconductor film as a channel layer can achieve higher mobility than that of amorphous silicon. Specifically, zinc oxide (ZnO) films, and InGaZnO films obtained by adding a gallium oxide ($Ga_2O_3$) and an indium oxide ($In_2O_3$) to a zinc oxide (ZnO) can be used as the oxide-based semiconductor film.

In the pixel portion, the drain electrode 8 extends up to below the auxiliary capacitance electrode 105 of the auxiliary capacitance portion as the pixel electrode 11.

A plurality of contact holes are formed in the first gate insulating film 106. That is, as shown in the portion (c) of FIG. 12, the contact holes 15 and 17 are formed so as to pass through the first gate insulating film 106 and reach the semiconductor film 12. Those holes reach the semiconductor film 12 above the source electrode 7 and the semiconductor film 12 above the drain electrode 8, and thus are referred to as source-electrode-portion contact hole 15 and drain-electrode-portion contact hole 17, respectively.

The contact hole 16 is formed so as to pass through the first gate insulating film 106 and reach the source wire 9, which is referred to as source-wire-portion contact hole 16. The contact hole 18 is formed so as to pass through the first gate insulating film 106 and reach the drain electrode 8, which is referred to as pixel-drain contact hole 18.

The upper-layer source electrode 21 is disposed, which is in contact with and is electrically connected to the surface of the semiconductor film 12 formed therebelow, through the source-electrode-portion contact hole 15. The upper-layer source wire 22 is disposed, which is in contact with and is electrically connected to the surface of the source wire 9 formed therebelow, through the source-wire-portion contact hole 16.

The upper-layer source electrode 21 and the upper-layer source wire 22 are integrally formed, and the source electrode 7 is electrically connected to the upper-layer source electrode 21 via the source wire 9.

The upper-layer drain electrode 23 that is in contact with and is electrically connected to the surface of the semiconductor film 12 formed therebelow through the drain-electrode-portion contact hole 17 is disposed. The upper-layer drain electrode 23 is in contact with and is electrically connected to the surface of the drain electrode 8 formed therebelow, through the pixel-drain contact hole 18. Thus, the upper-layer drain electrode 23 is configured to electrically connect the drain electrode 8, the semiconductor film 12, and the pixel electrode 11.

As shown in the portion (b) of FIG. 12, a contact hole 120 is formed so as to pass through the first gate insulating film 106 and reach the source terminal 10, which is referred to as first source-terminal-portion contact hole 120. An upper-layer source terminal 125 is disposed, which is in contact with and is electrically connected to the surface of the source terminal 10 formed therebelow, through the first source-terminal-portion contact hole 120.

A second gate insulating film 114 is formed to entirely cover the substrate 1 including the upper-layer source electrode 21 and the upper-layer source wire 22. In the second gate insulating film 114, a contact hole 220 for exposing the surface of the upper-layer source terminal 125 is formed in the source terminal portion shown in the portion (b) of FIG. 12, which is referred to as second source-terminal-portion contact hole 220. A source terminal pad 225 that is in contact with the upper-layer source terminal 125 to be electrically connected thereto through the second source-terminal-portion contact hole 220 is disposed.

A gate wire 103 is disposed in the wire intersecting portion shown in the portion (c) of FIG. 12, a gate electrode 102 is disposed in the TFT portion shown therein, and an auxiliary capacitance electrode 105 is disposed in the auxiliary capacitance portion shown therein. A gate terminal pad 104 is disposed in the gate terminal portion shown in the portion (a) of FIG. 12.

Next, the planar configuration of the pixel 204B is described. As shown in FIG. 11, a plurality of gate wires 103 are provided in parallel with each other so as to extend laterally (in the X direction) to be perpendicular to a plurality of source wires 9. The gate wire 103 is formed to be integrated with the gate electrode 102 of the TFT 201. That is, the gate wire 103 of the TFT 201 portion serves as the gate electrode 102. The gate electrode 102 is formed to become wider than the gate wire 103.

The upper-layer source electrode 21 and the upper-layer drain electrode 23 are provided via the second gate insulating film 114 (FIG. 12) below the gate electrode 102. The upper-layer source electrode 21 and the upper-layer drain electrode 23 are arranged to be opposed to each other and be spaced from each other below the gate electrode 102.

One end of the gate wire 103 is connected to the gate terminal pad 104. The scanning signal drive circuit 205 (FIG. 1) is connected to the gate terminal pad 104 such that a scanning signal is supplied to the gate wire 103.

The source wire 9 is provided to extend longitudinally (in the Y direction), and the source electrode 7 branches toward the X direction from somewhere in the middle of the source wire 9 and extends to overlap the portion below the gate electrode 2. The upper-layer source wire 22 is disposed above the source wire 9 such that they overlap each other, and the upper-layer source electrode 21 is disposed above the source electrode 7 such that they overlap each other.

One end of the source wire 9 is connected to the source terminal 10. The upper-layer source terminal 125 is connected to the source terminal 10 through the first source-terminal-portion contact hole 120, and the source terminal pad 225 is connected to the upper-layer source terminal 125 through the second source-terminal-portion contact hole 220. The display signal drive circuit 206 (FIG. 1) is connected to the source terminal pad 225 such that an image display signal is supplied to the source wire 9.

The pixel electrode 11 is formed to extend from the drain electrode 8, and a part of the pixel electrode 11 overlaps a part of the auxiliary capacitance electrode 105 via the gate insulating film 6. In this region, the auxiliary capacitor 209 for the pixel electrode is formed. The TFT substrate 200 is used in a transmissive liquid crystal display device, and thus, the pixel electrode 11 is formed of a light-transmitting conductive film.

The auxiliary capacitance electrode 105 is disposed in a portion corresponding to the edge portion of the pixel area so as to have a square U-shape in plan view. The auxiliary capacitance electrode 105 is not limited to a square U-shape but may be straight or may be L-shaped as long as a desired auxiliary capacitance is obtained.

<Manufacturing Method>

Next, a method of manufacturing the TFT substrate according to the second preferred embodiment is described with reference to FIGS. 13 to 18. The cross-sectional view showing the last step corresponds to FIG. 12, and the portions (a) to (c) of FIG. 12 respectively represent the same portions in the cross-sectional views illustrating the manufacturing steps in the description below.

First, the substrate 1 is cleaned with a cleaning fluid or pure water. Here, a glass substrate having a thickness of 0.5 mm is used as the substrate 1. Then, a first conductive film (not shown) is deposited entirely on one main surface of the cleaned substrate 1.

As the first conductive film, a light-transmitting conductive film is deposited. As the light-transmitting conductive film, an ITO film (mixing ratio of an indium oxide $In_2O_3$ and a tin oxide $SnO_2$ is, for example, 90:10 wt. %) is used in the second preferred embodiment. An ITO film generally has a stable crystalline (polycrystalline) structure at a room temperature. Here, the ITO film is deposited with a gas obtained by mixing a gas containing hydrogen (H), for example, a hydrogen ($H_2$) gas or vapor ($H_2O$) into argon (Ar) through a well-known sputtering process, so that an ITO film having a thickness of 100 nm is formed in an amorphous state.

Figure 13:
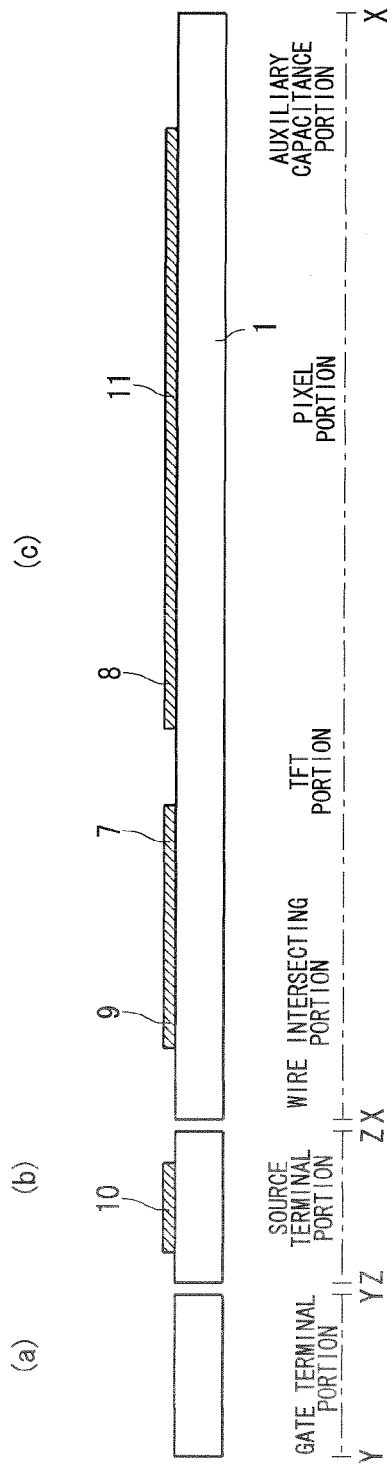
FIGS. 13 to 18 are views each showing the step of manufacturing the TFT substrate according to the second preferred embodiment of the present invention.

After that, a resist material is applied onto the ITO film, and a photoresist pattern is formed through a photolithographic step (first time). Then, the ITO film is patterned by etching with the photoresist pattern being an etching mask, and the photoresist pattern is removed. As a result, as shown in FIG. 13, the source terminal 10, source wire 9, source electrode 7, drain electrode 8, and pixel electrode 11 are formed on the substrate 1.

In this etching step, well-known wet etching with an oxalic-acid-based solution can be used.

The reason why a light-transmitting conductive film is used as the first conductive film is that in a case of a liquid crystal display device that performs display through transmission of back light, the formation of a light-transmitting pixel electrode is required.

After that, the substrate 1 is heat-treated at a temperature of 200° C. further. As a result of the heat treatment, the ITO film in an amorphous state is crystallized and changes into a polycrystalline ITO film. The ITO film in a polycrystalline state shows excellent chemical stability, and thus does not dissolve in typical etching solutions (containing oxalic acid) other than aqua regia (hydrochloric acid+nitric acid)-based etching solutions. This enables to secure etching selectivity with a metal film to be formed thereabove. The heat-treatment temperature in crystallization of an amorphous ITO film needs to be set at least higher than the temperature (crystallization temperature) at which crystallization begins. The crystallization temperature of an amorphous ITO film having a typical composition is approximately 150° C., and thus, the heat-treatment temperature is desirably 150° C. or higher.

Figure 14:
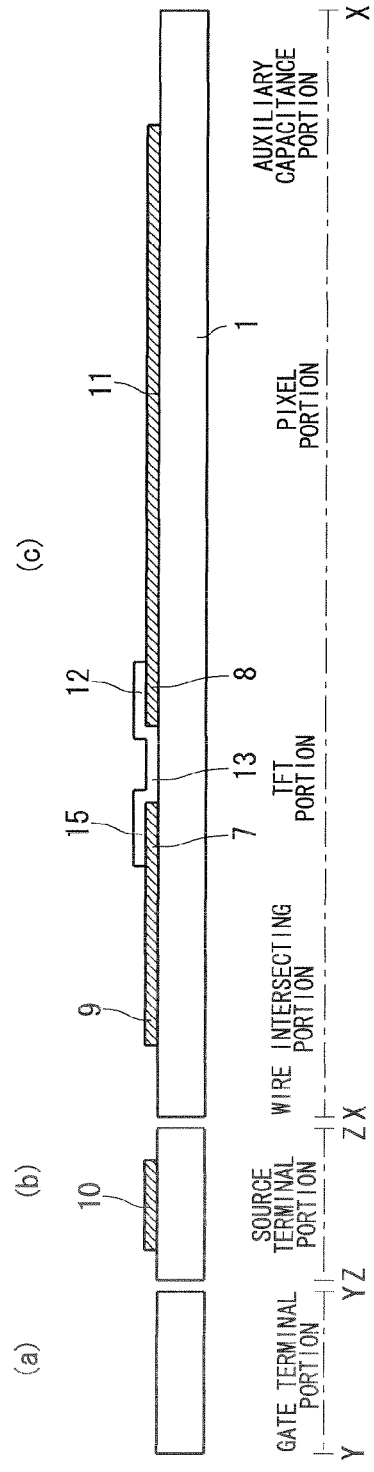

Next, in the step shown in FIG. 14, the semiconductor film 12 is formed so as to straddle the source electrode 7 and the drain electrode 8.

In the formation of the semiconductor film 12, first, an oxide-based semiconductor film (InGaZnO film) containing In, Ga, and Zn is formed entirely on one main surface of the substrate 1. The oxide-based semiconductor film is deposited by the sputtering process using an InGaZnO target, and here, is deposited by the sputtering process with an Ar gas using an InGaZnO target where an atomic composition ratio of In:Ga:Zn:O is 1:1:1:4. In this case, an atomic composition ratio of oxygen is normally smaller than that of the stoichiometric composition, resulting in an oxide film in an oxygen and ion deficient state (in the example above, the composition ratio of O is less than four). Therefore, it is desirable to perform sputtering with an Ar gas mixed with an oxygen ($O_2$) gas.

In the second preferred embodiment, sputtering is performed with a mixed gas obtained by adding, at a division ratio, a 10% of $O_2$ gas to an Ar gas, and an InGaZnO film is deposited to have a thickness of 50 nm. The InGaZnO film is deposited to have an amorphous structure. The crystallization temperature of the InGaZnO film having an amorphous structure is typically 500° C. or higher, and most of the film is stable while having an amorphous structure at a room temperature.

After that, a resist material is applied onto the InGaZnO film, and a photoresist pattern is formed through the photolithographic step (second time). Then, the InGaZnO film is patterned by etching with the photoresist pattern being an etching mask, and the photoresist pattern is removed. As a result, as shown in FIG. 14, the semiconductor film 12 that straddles the source electrode 7 and the drain electrode 8 is obtained.

In the step of etching the InGaZnO film, well-known wet etching with an oxalic-acid-based solution can be used.

On this occasion, the ITO film has been polycrystallized, and thus, the source electrode 7, drain electrode 8, source wire 9, source terminal 10, and pixel electrode 11 that have been formed in the preceding steps are not etched with an oxalic-acid-based solution. Therefore, the pattern does not disappear.

Further, the InGaZnO-based semiconductor film and ITO-based conductive film of the same oxide are brought into contact to be electrically connected. This enables to prevent an interface reaction (redox reaction) therebetween. Accordingly, the contact resistance (interface resistance) in the interface portion between the semiconductor film 12 and each of the source electrode 7 and drain electrode 8 of the TFT 201 can be kept low, leading to an effect that the on-current and mobility are increased to improve TFT characteristics.

Figure 15:
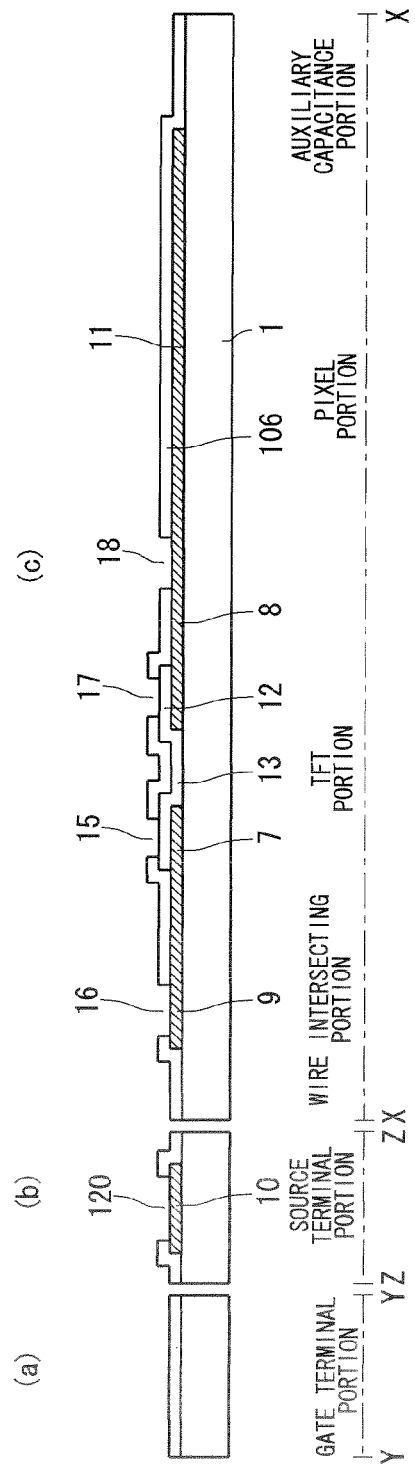

Next, in the step shown in FIG. 15, the first gate insulating film 106 is deposited entirely on one main surface of the substrate 1 to cover the source electrode 7, drain electrode 8, source wire 9, source terminal 10, pixel electrode 11, and semiconductor film 12.

The first gate insulating film 106 can be obtained by forming a silicon oxide (SiO) film by a CVD process. Here, a silicon oxide film having a thickness of 200 nm is deposited under a substrate heating condition of approximately 250° C. The silicon oxide film has weak barrier properties against (H$_2$O), hydrogen (H2), or impurity elements that affect TFT characteristics, such as sodium (Na) and potassium (K), and thus may have a laminated structure in which, for example, a silicon nitride (SiN) film having excellent barrier properties or the like is provided below the silicon oxide film.

After that, a resist material is applied onto the silicon oxide film, and a photoresist pattern is formed through the photolithographic step (third time). Then, the silicon oxide film is etched with the photoresist pattern being an etching mask.

In this etching step, a well-known dry etching process using a fluorine-based gas can be used. Through this step, the source-electrode-portion contact hole 15, source-wire-portion contact hole 16, drain-electrode-portion contact hole 17, pixel-drain contact hole 18, and first source-terminal-portion contact hole 120 passing through the first gate insulating film 106 are formed.

The source-electrode-portion contact hole 15 and the drain-electrode-portion contact hole 17 are provided to reach the surface of the semiconductor film 12 above the source electrode 7 and the drain electrode 8, respectively. The source-wire-portion contact hole 16 is provided to reach the surface of the source wire 9, and the pixel-drain contact hole 18 is provided to reach the surface of the drain electrode 8. The first source-terminal-portion contact hole 120 is provided to reach the surface of the source terminal 10.

Figure 16:
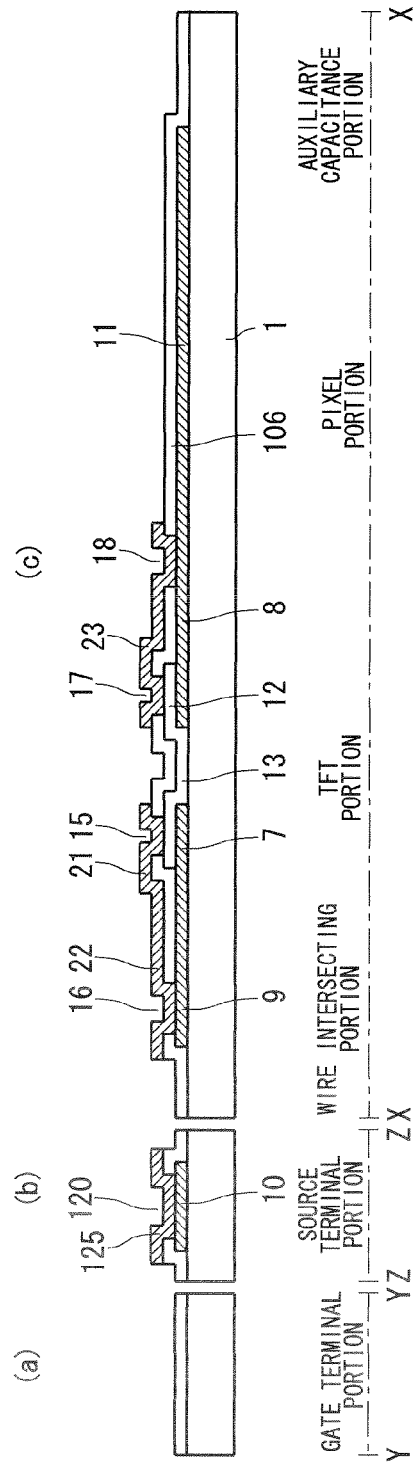

Next, in the step shown in FIG. 16, the upper-layer source electrode 21, upper-layer source wire 22, upper-layer drain electrode 23, and upper-layer source terminal 125 are formed.

In the formation of them, first, a second conductive film (not shown) is formed entirely on one main surface of the substrate 1.

For example, Cr, Mo, Ti, Cu, Ta, W, Al, and alloys thereof obtained by adding trace amounts of other elements thereto can be used as the second conductive film. Alternatively, the second conductive film may have a laminated structure obtained by forming two or more layers of the metals and alloys thereof. The use of the metals and alloys thereof enables to obtain a low-resistance film having a resistivity value of 50 µΩcm or less.

In the second preferred embodiment, a Mo film is used as the second conductive film, and the Mo film is deposited to have a thickness of 200 nm by a well-known sputtering process with an Ar gas. After that, a resist material is applied onto the Mo film, and a photoresist pattern is formed through the photolithographic step (fourth time). Then, the Mo film is patterned by etching with the photoresist pattern being an etching mask, and the photoresist pattern is removed. As a result, as shown in FIG. 16, the upper-layer source electrode 21, upper-layer source wire 22, upper-layer drain electrode 23, and upper-layer source terminal 125 are formed.

Although well-known wet etching with a solution containing phosphoric acid, nitric acid, and acetic acid is used in this etching step, the first gate insulating film 106 covers the semiconductor film 12 formed therebelow. Therefore, the pattern does not disappear by etching of the metal film.

The upper-layer source wire 22 is in contact with and is electrically connected to the surface of the source wire 9 formed therebelow, through the source-wire-portion contact hole 16.

The upper-layer source wire 22 and the upper-layer source electrode 21 are integrally formed, and the upper-layer source electrode 21 is in contact with and is electrically connected to the surface of the semiconductor film 12 on the source electrode 7 formed therebelow, through the source-electrode-portion contact hole 15. Accordingly, the upper-layer source electrode 21 and the upper-layer source wire 22 are configured to electrically connect the semiconductor film 12 and the source electrode 7 through the source-electrode-portion contact hole 15, the source-wire-portion contact hole 16, and the source wire 9.

The upper-layer drain electrode 23 is in contact with and is electrically connected to the surface of the semiconductor film 12 on the drain electrode 8 formed therebelow, through the drain-electrode-portion contact hole 17. Further, the upper-layer drain electrode 23 is in contact with and is electrically connected to the surface of the drain electrode 8 formed therebelow, through the pixel-drain contact hole 18. Therefore, the upper-layer drain electrode 23 is configured to electrically connect the semiconductor film 12, the drain electrode 8, and the pixel electrode 11 through the drain-electrode-portion contact hole 17 and the pixel-drain contact hole 18.

The first source-terminal-portion contact hole 120 is formed for exposing the surface of the source terminal 10, and the upper-layer source terminal 125 is electrically connected to the source terminal 10 formed therebelow, through the first source-terminal-portion contact hole 120.

Figure 17:
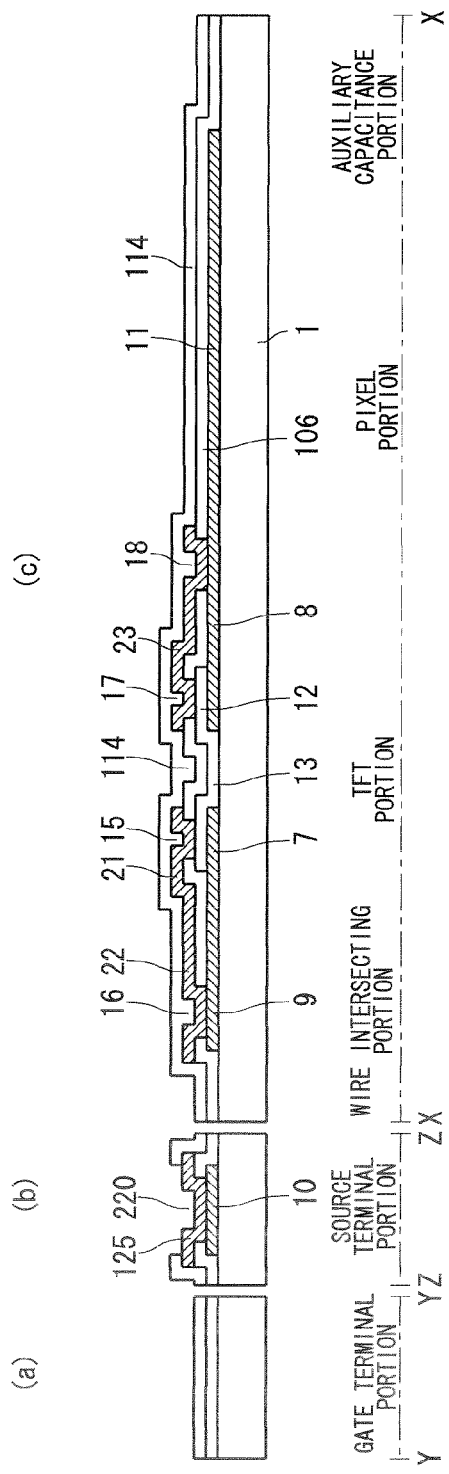

Next, in the step shown in FIG. 17, the second gate insulating film 114 is deposited entirely on one main surface of the substrate 1 so as to cover the upper-layer source electrode 21, upper-layer source wire 22, upper-layer drain electrode 23, and upper-layer source terminal 125.

The second gate insulating film 114 can be obtained by forming a silicon oxide (SiO) film by the CVD process. Here, a silicon oxide film having a thickness of 200 nm is deposited under the substrate heating condition at approximately 250° C.

After that, a resist material is applied onto the silicon oxide film, and a photoresist pattern is formed through the photolithographic step (fifth time). Then, the silicon oxide film is etched with the photoresist pattern being an etching mask.

In this etching step, a well-known dry etching process using a fluorine-based gas can be used. Through this step, the second source-terminal-portion contact hole 220 passing through the second gate insulating film 114 is formed.

The second source-terminal-portion contact hole 220 is formed for exposing the surface of the upper-layer source terminal 125.

Figure 18:
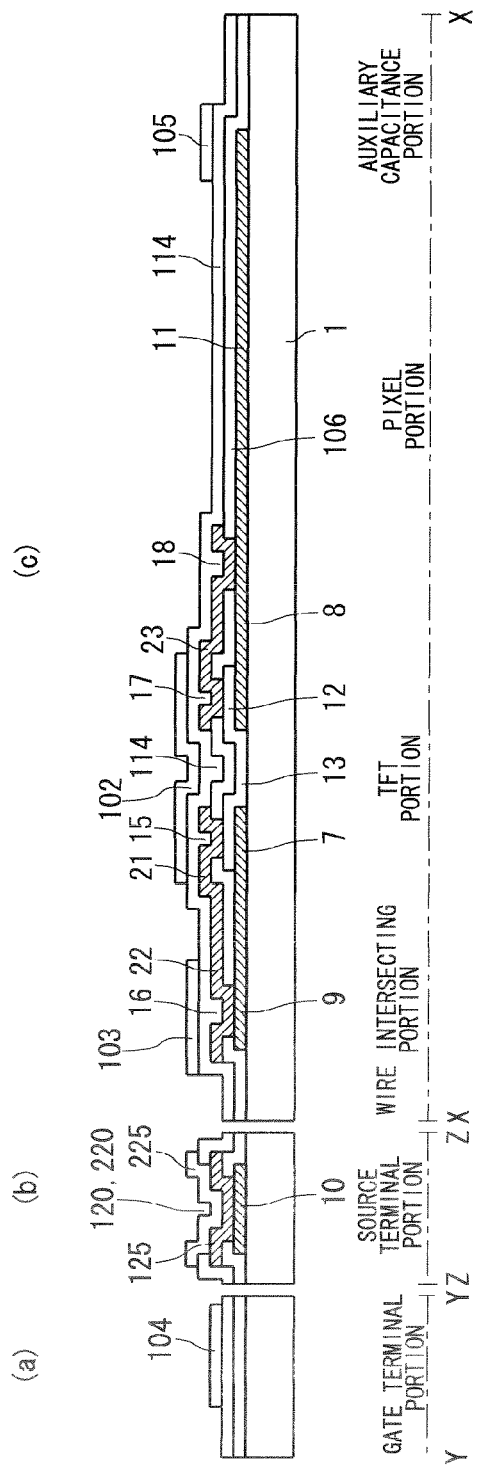

Next, in the step shown in FIG. 18, the gate terminal pad 104, source terminal pad 225, gate wire 103, gate electrode 102, and auxiliary capacitance electrode 105 are formed.

In the formation of them, first, a third conductive film (not shown) is formed entirely on one main surface of the substrate 1.

For example, Cr, Mo, Ti, Cu, Ta, W, Al, and alloys thereof obtained by adding trace amounts of other elements thereto can be used as the third conductive film. Alternatively, the third conductive film may have a laminated structure obtained by forming two or more layers of the metals and alloys thereof. The use of the metals and alloys thereof enables to obtain a low-resistance film having a resistivity value of 50 µΩcm or less.

In the second preferred embodiment, a Mo film is used as the third conductive film, and the Mo film is deposited to have a thickness of 200 nm by a well-known sputtering process with an Ar gas. After that, a resist material is applied onto the Mo film, and a photoresist pattern is formed through the photolithographic step (sixth time). Then, the Mo film is patterned by etching with the photoresist pattern being an etching mask, and the photoresist pattern is removed. As a result, as shown in FIG. 18, the gate terminal pad 104, source terminal pad 225, gate wire 103, gate electrode 102, and auxiliary capacitance electrode 105 are formed. The source terminal pad 225 is electrically connected to the upper-layer source terminal 125 through the second source-terminal-portion contact hole 220.

In this etching step, well-known wet etching with a solution containing phosphoric acid, nitric acid, and acetic acid can be used. Through the steps described above, the TFT substrate is completed.

Then, an alignment film and a spacer are formed on the surface of the completed TFT substrate. The alignment film is provided for arranging liquid crystals and is formed of, for example, polyimide. A counter substrate including a color filter and an alignment film is prepared, and the TFT substrate and the counter substrate are bonded together. Then, liquid crystals are injected into and held in a gap formed between the both substrates by the spacer. After that, a polarizing plate, a phase difference plate, a backlight unit, and the like are disposed outside the both substrates, to thereby obtain a liquid crystal display device (not shown).

<Effects>

As described above, in the method of manufacturing the TFT substrate according to the second preferred embodiment, a high-performance TFT substrate for a liquid crystal display device that includes an oxide semiconductor for a semiconductor active layer can be manufactured through six photolithographic steps.

In the second preferred embodiment, the same-oxide-based semiconductor film and conductive film are brought into contact with each other to be electrically connected to each other. Therefore, an interface reaction (redox reaction) therebetween can be prevented, and an interface resistance can be reduced.

The second gate insulating film 114 is formed so as to cover the semiconductor film 12. The upper-layer source electrode 21 and the upper-layer drain electrode 23 to be electrically connected to the source electrode 7 and the drain electrode 8 that are formed therebelow, respectively, and to the semiconductor film 12 through the contact holes provided in the protective insulating film 14 are provided so as to be electrically connected to the source electrode and the drain electrode of the TFT 201 on the upper and lower surfaces of the semiconductor film 12. This increases the contact area between the semiconductor film 12 and each of the source electrode and the drain electrode, which enables to reduce an interface resistance further.

Even if the interface resistance of one of two interfaces between the source electrode 7 and the semiconductor film 12 and between the upper-layer source electrode 21 and the semiconductor film 12 is high, the other interface thereof can compensate for the high interface resistance. Also, even if the interface resistance of one of two interfaces between the drain electrode 8 and the semiconductor film 12 and between the upper-layer drain electrode 23 and the semiconductor film 12 is high, the other interface thereof can compensate for the high interface resistance. Accordingly, an interface resistance can be kept low and also the generation of defects due to poor TFT characteristics can be prevented.

Further, source wiring is formed of two layers including the source wire 9 and the upper-layer source wire 22 that is electrically connected to the source wire 9 through a plurality of source-wire-portion contact holes 16 provided at regular intervals in the second gate insulating film 114. Therefore, even in a case where a poor pattern is generated in one source wire and the source wire is broken, the other source wire can compensate for the broken one, which enables to efficiently prevent an occurrence of defects due to breaking.

The upper-layer source wire 22 is formed of a metal film, which enables to reduce a resistance of a wire. This results in a configuration suitable for a display device required to have a lower resistance of a wire, such as a large display panel in which a wiring length is large and a high-definition panel in which a wiring width is small.

Even in a case where the upper-layer source wire 22 is formed of a metal film, the semiconductor film 12 formed therebelow is covered with the second gate insulating film 114. This prevents the semiconductor film 12 from disappearing by etching of the metal film and enables selective etching.

As described above, in the TFT substrate according to the second preferred embodiment, even in a case where an oxide semiconductor is used for a semiconductor active layer, the interface resistance between the semiconductor active layer and each of the source electrode and drain electrode can be kept low. Besides, an occurrence of defects due to a poor wring pattern can be prevented efficiently.

Besides, a TFT substrate whose operating speed is high and a display device including the same can be manufactured at high yield by achieving a TFT substrate including a high-mobility oxide-based semiconductor film. Accordingly, a high-performance TFT substrate and a liquid crystal display device can be manufactured with high productivity.

<Modification>

The second preferred embodiment has described that the TFT substrate 200 is used in a transmissive liquid crystal display device. Hereinafter, as a modification thereof, the configuration in a case where the TFT substrate 200 is used in a semi-transmissive liquid crystal display device is described with reference to FIGS. 19 and 20.

Figure 19:
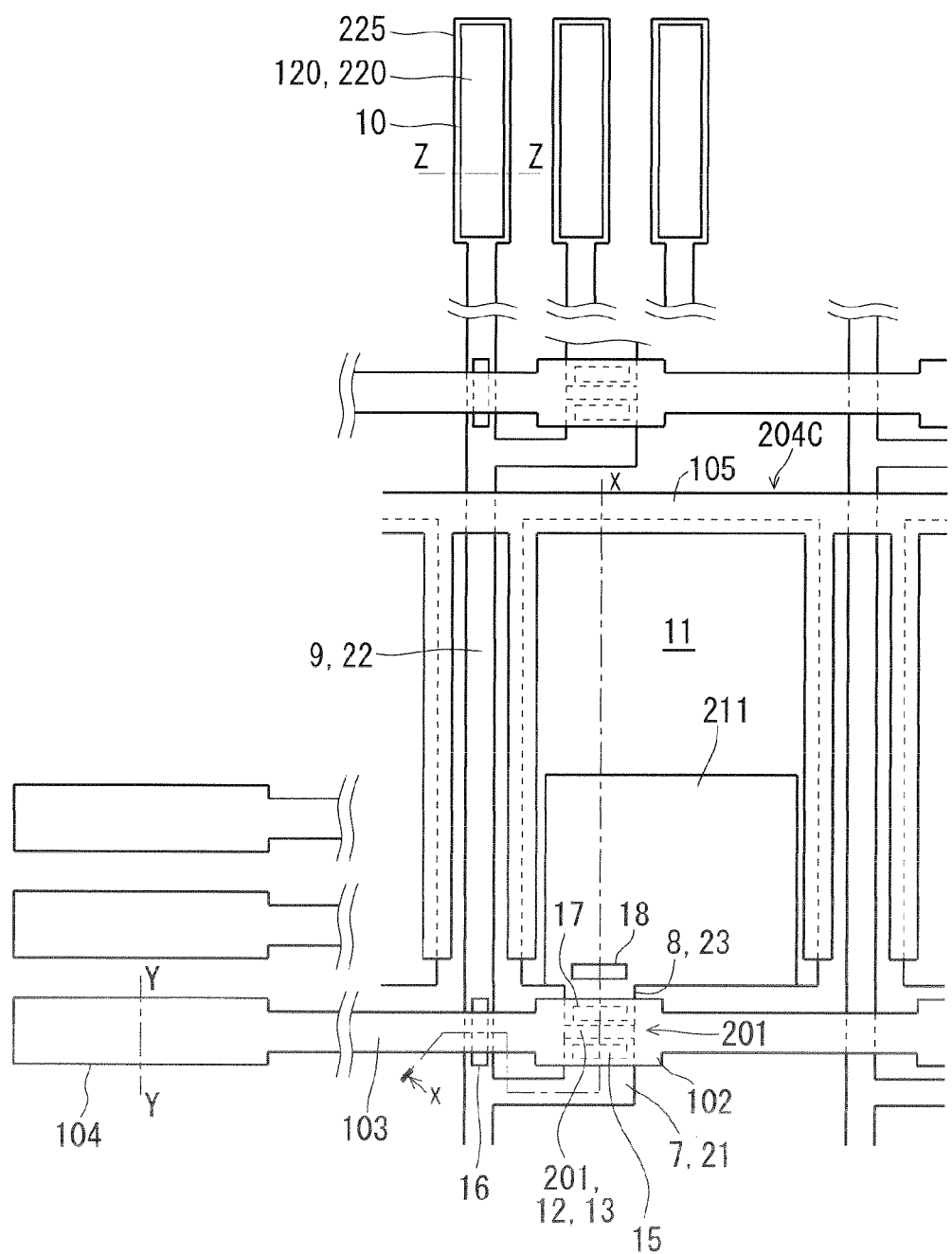
FIG. 19 is a view showing a planar configuration of a modification of the TFT substrate according to the second preferred embodiment of the present invention.
Figure 20:
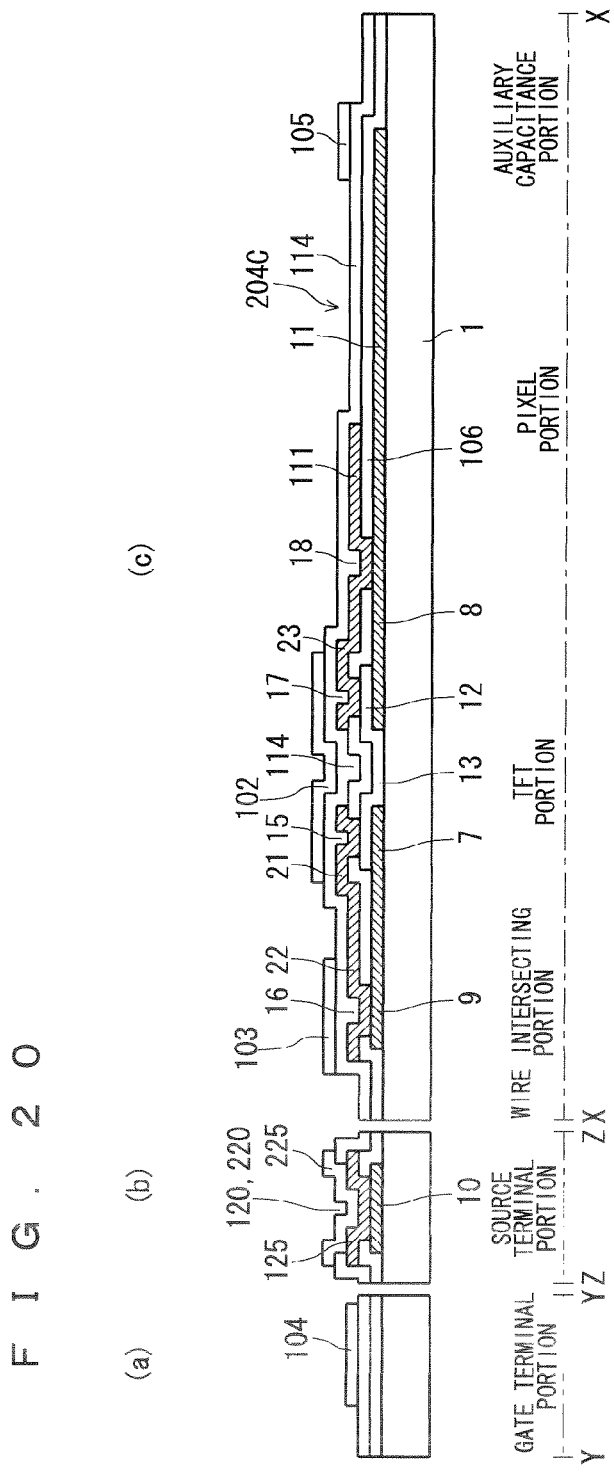
FIG. 20 is a view showing the cross-sectional configuration of the modification of the TFT substrate according to the second preferred embodiment of the present invention.

FIG. 19 is a plan view showing a planar configuration of a pixel 204C in a TFT substrate for use in a semi-transmissive liquid crystal display device. FIG. 20 is a cross-sectional view showing the cross-sectional configuration (cross-sectional configuration of a pixel portion and a TFT portion) at the line X-X in FIG. 19, the cross-sectional configuration (cross-sectional configuration of a gate terminal portion) at the line Y-Y in FIG. 19, and the cross-sectional configuration (cross-sectional configuration of a source terminal portion) at the line Z-Z in FIG. 19 by portion (c), portion (a), and portion (b), respectively. The same components as those of the pixel 204 shown in FIGS. 2 and 3 are denoted by the same reference symbols, and repetitive description is omitted.

As shown in FIGS. 19 and 20, the pixel 204C is configured such that the upper-layer pixel electrode 111 extends from the upper-layer drain electrode 23, above the pixel electrode 11 formed of a light-transmitting conductive film therebelow. A light reflecting surface (not shown) is formed of aluminum (Al) or silver (Ag) having high light reflectance and an alloy film containing the above as a main component as the surface (surface on the side opposite to the counter substrate) of the upper-layer pixel electrode 111, so that a TFT substrate suitable for a semi-transmissive liquid crystal display device including a pixel display portion that operates through light transmission and reflection can be manufactured.

The ratio between the transmissive display area and reflective display area of the pixel 204C can be appropriately changed by changing the area ratio of the upper-layer pixel electrode 111 extending from the upper-layer drain electrode 23. FIG. 19 shows an example in which the upper-layer pixel electrode 111 covers about 40% of the pixel electrode 11 formed therebelow. Through such formation that the upper-layer pixel electrode 111 entirely covers the pixel electrode 11 formed therebelow, a totally reflective liquid crystal display device can be obtained.

As described above, with the configuration in which the upper-layer pixel electrode 111 extends from the upper-layer drain electrode 23 above the pixel electrode 11 formed therebelow, a TFT substrate suitable for a semi-transmissive liquid crystal display device can be manufactured without adding a new photolithographic step.

<Third Preferred Embodiment>

A third preferred embodiment of the present invention is described with reference to FIGS. 21 to 27. The third preferred embodiment adopts a bottom gate structure in which the gate electrode 2 is formed as the lowermost layer on the substrate 1 as in the first preferred embodiment.

<Configuration of Pixel of TFT Substrate>

Figure 21:
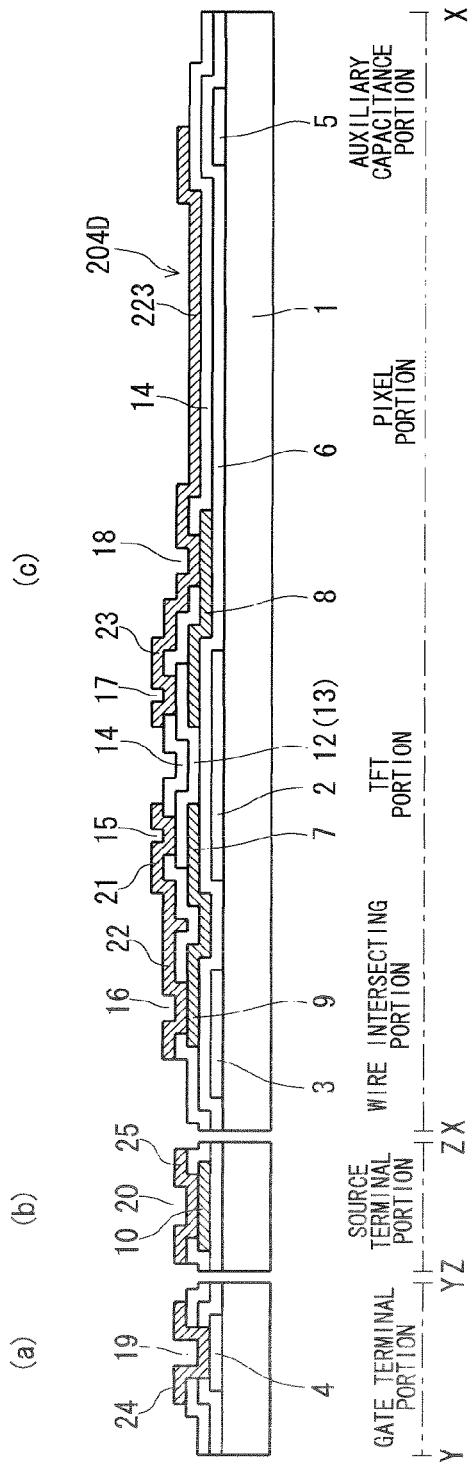
FIG. 21 is a view showing the cross-sectional configuration of a pixel of a TFT substrate according to a third preferred embodiment of the present invention.

First, the configuration of a pixel 204D according to the third preferred embodiment is described with reference to FIG. 21. The planar configuration thereof is basically the same as that of the pixel 204 shown in FIG. 2. FIG. 21 is a cross-sectional view showing the cross-sectional configuration of a portion corresponding to the line X-X in FIG. 2, the cross-sectional configuration of a portion corresponding to the line Y-Y in FIG. 2, and the cross-sectional configuration of a portion corresponding to the line Z-Z in FIG. 2 by portion (c), portion (a), and portion (b), respectively. The same components as those of the pixel 204 shown in FIGS. 2 and 3 are denoted by the same reference symbols, and repetitive description is omitted. Further, description is given below assuming that the TFT substrate 200 is used in a transmissive liquid crystal display device.

The gate terminal 4 is disposed in the gate terminal portion shown in the portion (a) of FIG. 21. The gate wire 3 is disposed in the wire intersecting portion shown in the portion (c) of FIG. 21, the gate electrode 2 is disposed in the TFT portion shown therein, and the auxiliary capacitance electrode 5 is disposed in the auxiliary capacitance portion shown therein. The insulating film 6 is disposed so as to cover the gate terminal 4, the gate wire 3, the gate electrode 2, and the auxiliary capacitance electrode 5. The insulating film 6 functions as a gate insulating film in the TFT portion, and thus may be referred to as first gate insulating film 6.

The same conductive film is selectively disposed on the gate insulating film 6 to form wires and electrodes. That is, in the TFT portion shown in the portion (c) of FIG. 21, the source electrode 7 and the drain electrode 8 formed of a conductive film are disposed to be spaced from each other on the gate insulating film 6, the semiconductor film 12 is disposed so as to straddle the source electrode 7 and the drain electrode 8, and the channel portion 13 is formed in the surface of the semiconductor film 12 provided on the gate insulating film 6 between the source electrode 7 and the drain electrode 8.

The semiconductor film 12 is, for example, an oxide-based semiconductor film. The use of the oxide-based semiconductor film as a channel layer can achieve higher mobility than that of amorphous silicon. Specifically, zinc oxide (ZnO) films, InGaZnO films obtained by adding a gallium oxide ($Ga_2O_3$) and an indium oxide ($In_2O_3$) to a zinc oxide (ZnO) can be used as the oxide-based semiconductor film.

In the source terminal portion shown in the portion (b) of FIG. 21, the source terminal 10 formed of a conductive film is disposed on the gate insulating film 6.

The protective insulating film 14 is formed so as to entirely cover the substrate 1, which covers the semiconductor film 12, source electrode 7, drain electrode 8, pixel electrode 11, and source terminal 10.

A plurality of contact holes are formed in the protective insulating film 14. That is, as shown in the portion (c) of FIG. 21, the source-electrode-portion contact hole 15 and the drain-electrode-portion contact hole 17 are formed so as to pass through the protective insulating film 14 and reach the semiconductor film 12.

The source-wire-portion contact hole 16 is formed so as to pass through the protective insulating film 14 and reach the source wire 9, and the pixel-drain contact hole 18 is formed so as to pass through the protective insulating film 14 and reach the drain electrode 8.

The upper-layer source electrode 21 is disposed, which is in contact with and is electrically connected to the surface of the semiconductor film 12 formed therebelow, through the source-electrode-portion contact hole 15. The upper-layer source wire 22 is disposed, which is in contact with and is electrically connected to the surface of the source wire 9 formed therebelow through the source-wire-portion contact hole 16.

The upper-layer source electrode 21 and the upper-layer source wire 22 are integrally formed, and the source electrode 7 is electrically connected to the upper-layer source electrode 21 via the source wire 9.

The upper-layer drain electrode 23 is disposed, which is in contact with and is electrically connected to the surface of the semiconductor film 12 formed therebelow through the drain-electrode-portion contact hole 17. The upper-layer drain electrode 23 is in contact with and is electrically connected to the surface of the drain electrode 8 formed therebelow, through the pixel-drain contact hole 18. Thus, the upper-layer drain electrode 23 is configured to electrically connect the drain electrode 8, the semiconductor film 12, and the semiconductor film 12.

The upper-layer drain electrode 23 extends up to above the auxiliary capacitance electrode 5 of the auxiliary capacitance portion as the pixel electrode 223 in the pixel electrode portion. As described above, in the pixel 204D according to the third preferred embodiment, the pixel electrode 223 is configured to extend from the upper-layer drain electrode 23, and the pixel electrode 223 is disposed as the uppermost layer. The TFT substrate 200 is used in a transmissive liquid crystal display device, and thus, the pixel electrode 223 is formed of a light-transmitting conductive film.

As shown in the portion (a) of FIG. 21, the gate-terminal-portion contact hole 19 that passes through the protective insulating film 14 and the gate insulating film 6 and reaches the gate terminal 4 is formed. Besides, the gate terminal pad 24 is disposed, which is in contact with and is electrically connected to the surface of the gate terminal 4 formed therebelow, through the gate-terminal-portion contact hole 19.

As shown in the portion (b) of FIG. 21, the source-terminal-portion contact hole 20 that passes through the protective insulating film 14 and reaches the source terminal 10 is formed. Besides, the source terminal pad 25 is disposed, which is in contact with and is electrically connected to the surface of the source terminal 10 formed therebelow, through the source-terminal-portion contact hole 20.

<Manufacturing Method>

Next, a method of manufacturing the TFT substrate according to the third preferred embodiment is described with reference to FIGS. 22 to 26. The cross-sectional view showing the last step corresponds to FIG. 21, and the portions (a) to (c) of FIG. 21 respectively represent the same portions in the cross-sectional views illustrating the manufacturing steps in the description below.

First, the substrate 1 is cleaned with a cleaning fluid or pure water. Here, a glass substrate having a thickness of 0.5 mm is used as the substrate 1. Then, a first conductive film (not shown) is deposited entirely on one main surface of the cleaned substrate 1.

For example, Cr, Mo, Ti, Cu, Ta, W, Al, and alloys thereof obtained by adding trace amounts of other elements thereto can be used as the first conductive film. Alternatively, the first conductive film may have a laminated structure obtained by forming two or more layers of the metals and alloys thereof. The use of the metals and alloys thereof enables to obtain a low-resistance film having a resistivity value of 50 μΩcm or less.

Figure 22:
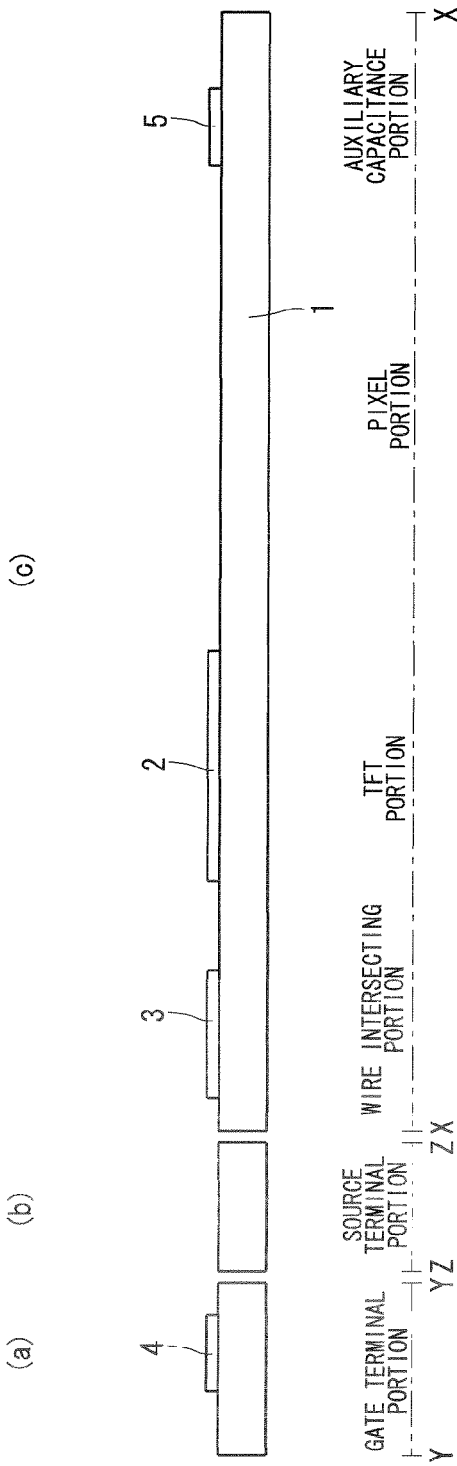

In the third preferred embodiment, a Mo film is used as the first conductive film, and the Mo film is deposited to have a thickness of 200 nm by a well-known sputtering process using an Ar gas. After that, a resist material is applied onto the Mo film, and a photoresist pattern is formed through a photolithographic step (first time). Then, the Mo film is patterned by etching with the photoresist pattern being an etching mask, and the photoresist pattern is removed. As a result, as shown in FIG. 22, the gate terminal 4, gate wire 3, gate electrode 2, and auxiliary capacitance electrode 5 are formed on the substrate 1.

In this etching step, well-known wet etching with a solution containing phosphoric acid, nitric acid, and acetic acid can be used.

Then, in the step shown in FIG. 23, the gate insulating film 6 is deposited entirely on one main surface of the substrate 1 to cover the gate terminal 4, gate wire 3, gate electrode 2, and auxiliary capacitance electrode 5. After that, a second conductive film (not shown) is deposited on the gate insulating film 6.

The gate insulating film 6 can be obtained by forming a silicon oxide (SiO) film by a CVD process. Here, a silicon oxide film having a thickness of 300 nm is deposited under a substrate heating condition of approximately 300° C. The silicon oxide film has weak barrier properties against ($H_2O$), hydrogen ($H_2$), or impurity elements that affect TFT characteristics, such as sodium (Na) and potassium (K), and thus may have a laminated structure in which, for example, a silicon nitride (SiN) film having excellent barrier properties or the like is provided below the silicon oxide film.

For example, Cr, Mo, Ti, Cu, Ta, W, Al, and alloys thereof obtained by adding trace amounts of other elements thereto can be used as the second conductive film. Alternatively, the second conductive film may have a laminated structure obtained by forming two or more layers of the metals and alloys thereof. The use of the metals and alloys thereof enables to obtain a low-resistance film having a resistivity value of 50 μΩcm or less.

In the third preferred embodiment, a Mo film is used as the third conductive film, and the Mo film is deposited to have a thickness of 200 nm by a well-known sputtering process with an Ar gas. After that, a resist material is applied onto the Mo film, and a photoresist pattern is formed through the photolithographic step (second time). Then, the Mo film is patterned by etching with the photoresist pattern being an etching mask, and the photoresist pattern is removed. As a result, as shown in FIG. 23, the source terminal 10, source wire 9, source electrode 7, and drain electrode 8 are formed on the gate insulating film 6.

Next, in the step shown in FIG. 24, the semiconductor film 12 is formed so as to straddle the source electrode 7 and the drain electrode 8.

In the formation of the semiconductor film 12, first, an oxide-based semiconductor film (InGaZnO film) containing In, Ga, and Zn is formed entirely on one main surface of the substrate 1. The oxide-based semiconductor film is deposited by the sputtering process using an InGaZnO target, and here, is deposited by the sputtering process with an Ar gas using an InGaZnO target where an atomic composition ratio of In:Ga:Zn:O is 1:1:1:4. In this case, an atomic composition ratio of oxygen is normally smaller than that of the stoichiometric composition, resulting in an oxide film in an oxygen and ion deficient state (in the example above, the composition ratio of O is less than four). Therefore, it is desirable to perform sputtering with an Ar gas mixed with an oxygen ($O_2$) gas.

In the fourth preferred embodiment, sputtering is performed with a mixed gas obtained by adding, at a division ratio, a 10% of $O_2$ gas to an Ar gas, and an InGaZnO film is deposited to have a thickness of 50 nm. The InGaZnO film is deposited to have an amorphous structure. The crystallization temperature of the InGaZnO film having an amorphous structure is typically 500° C. or higher, and most of the film is stable while having an amorphous structure at a room temperature.

After that, a resist material is applied onto the InGaZnO film, and a photoresist pattern is formed through the photolithographic step (third time). Then, the InGaZnO film is patterned by etching with the photoresist pattern being an etching mask, and the photoresist pattern is removed. As a result, as shown in FIG. 24, the semiconductor film 12 that straddles the source electrode 7 and the drain electrode 8 is obtained.

In the step of etching the InGaZnO film, well-known wet etching with an oxalic-acid-based solution can be used.

On this occasion, the source electrode 7, drain electrode 8, source wire 9, and source terminal 10 that have been formed in the preceding steps are formed of a Mo film and are not etched with an oxalic-acid-based solution. Therefore, the pattern does not disappear.

Next, in the step shown in FIG. 25, the protective insulating film 14 is deposited entirely on one main surface of the substrate 1, and then, a contact hole passing through the protective insulating film 14 and the gate insulating film 6 is formed.

The protective insulating film 14 can be obtained by forming a silicon oxide (SiO) film to have a thickness of 300 nm under a substrate heating condition of approximately 250° C. by a CVD process.

After that, a resist material is applied onto the silicon oxide film, and a photoresist pattern is formed through the photolithographic step (fourth time). Then, the silicon oxide film is etched with the photoresist pattern being an etching mask.

In this etching step, a well-known dry etching process using a fluorine-based gas can be used. Through this step, the source-electrode-portion contact hole 15, source-wire-portion contact hole 16, drain-electrode-portion contact hole 17, pixel-drain contact hole 18, and source-terminal-portion contact hole 20 passing through the protective insulating film 14 are formed, and the gate-terminal-portion contact hole 19 passing through the protective insulating film 14 and the gate insulating film 6 can be formed at the same time.

The source-electrode-portion contact hole 15 and the drain-electrode-portion contact hole 17 are provided to reach the surface of the semiconductor film 12 above the source electrode 7 and the drain electrode 8, respectively. The source-wire-portion contact hole 16 is provided to reach the surface of the source wire 9, and the pixel-drain contact hole 18 is provided to reach the surface of the drain electrode 8. The gate-terminal-portion contact hole 19 and the source-terminal-portion contact hole 20 are provided to reach the surfaces of the gate terminal 4 and the source terminal 10, respectively.

Next, in the step shown in FIG. 26, the upper-layer source electrode 21, upper-layer source wire 22, upper-layer drain electrode 23, gate terminal pad 24, and source terminal pad 25 are formed.

In the formation of them, first, a third conductive film (not shown) is formed entirely on one main surface of the substrate 1.

It suffices that the third conductive film is light-transmitting. For example, an ITO film, an IZO (indium oxide $In_2O_3$+ zinc oxide ZnO) film, and a GZO (gallium oxide $Ga_2O_3$+ ZnO) film may be selected.

A resist material is applied onto the third conductive film, and a photoresist pattern is formed through the photolithographic step (fifth time). Then, the third conductive film is patterned by etching with the photoresist pattern being an etching mask, and the photoresist pattern is removed. As a result, as shown in FIG. 26, the upper-layer source electrode 21, upper-layer source wire 22, upper-layer drain electrode 23, pixel electrode 223, gate terminal pad 24, and source terminal pad 25 are formed.

In this etching step, in a case where an ITO film is selected for the third conductive film, well-known wet etching with an oxalic-acid-based solution can be used.

The upper-layer source wire 22 is in contact with and is electrically connected to the surface of the source wire 9 formed therebelow, through the source-wire-portion contact hole 16.

The upper-layer source wire 22 and the upper-layer source electrode 21 are integrally formed, and the upper-layer source electrode 21 is in contact with and is electrically connected to the surface of the semiconductor film 12 above the source electrode 7 formed therebelow, through the source-electrode-portion contact hole 15. Accordingly, the upper-layer source electrode 21 and the upper-layer source wire 22 are configured to electrically connect the semiconductor film 12 and the source electrode 7 through the source-electrode-portion contact hole 15, the source-wire-portion contact hole 16, and the source wire 9.

The upper-layer drain electrode 23 is in contact with and is electrically connected to the surface of the semiconductor film 12 on the drain electrode 8 formed therebelow, through the drain-electrode-portion contact hole 17. Further, the upper-layer drain electrode 23 is in contact with and is electrically connected to the surface of the drain electrode 8 formed therebelow, through the pixel-drain contact hole 18. Therefore, the upper-layer drain electrode 23 is configured to electrically connect the semiconductor film 12, the drain electrode 8, and the pixel electrode 223 through the drain-electrode-portion contact hole 17 and the pixel-drain contact hole 18.

The third conductive film is an oxide conductive film. Therefore, in the portions in which the upper-layer source electrode 21 and the upper-layer drain electrode 23 are in contact with the semiconductor film 12 being an InGaZnO-based semiconductor film, an interface reaction (redox reaction) therebetween can be prevented. This enables to suppress the contact resistance (interface resistance) in the interface portion between the semiconductor film 12 and each of the upper-layer source electrode 21 and the upper-layer drain electrode 23, leading to an effect that the on-current and mobility are increased to improve TFT characteristics.

The gate-terminal-portion contact hole 19 and the source-terminal-portion contact hole 20 are formed for exposing the surfaces of the gate terminal 4 and the source terminal 10, respectively, where the gate terminal pad 24 and the source terminal pad 25 are formed, respectively.

The protective insulating film 14 covers the semiconductor film 12 formed therebelow, which enables selective etching without disappearance of the pattern in etching of the third conductive film. Through the above, the configuration shown in FIG. 26 is obtained, and the TFT substrate is completed.

<Effects>

As described above, in the method of manufacturing the TFT substrate according to the third preferred embodiment, a high-performance TFT substrate for a liquid crystal display device that includes an oxide semiconductor for a semiconductor active layer can be manufactured through five photolithographic steps.

In the pixel 204D of the third preferred embodiment, though the source electrode 7 and the drain electrode 8 are formed of a metal film such as Mo film, the semiconductor film 12 is formed after the formation of the source electrode 7 and the drain electrode 8. Accordingly, even in a case where an oxide-based semiconductor film having a low resistance to solution is used as the semiconductor film 12, the semiconductor film 12 can be processed through selective etching without being affected by etching of the source electrode 7, the drain electrode 8, and the like.

Although the source electrode 7, the drain electrode 8, and the like are formed of a metal film such as Mo film, they are not etched with an oxalic-acid-based solution being an etching solution for the semiconductor film 12 formed of a ZnO-based or InGaZnO-based oxide semiconductor. This enables selective etching.

Further, the pixel electrode 223 is formed as the uppermost layer, which poses no problem regarding an etching solution resistance. In particular, the pixel electrode 223 is formed in the step after the formation of the semiconductor film 12, and thus, the pixel electrode 223 will not disappear during etching of the semiconductor film 12 formed of a ZnO-based or InGaZnO-based oxide.

Therefore, the pixel electrode 223 needs not to be limited to an ITO film having a polycrystalline structure with high chemical stability. In addition to an ITO film, materials that are susceptible to solutions such as IZO (indium oxide $In_2O_3$+zinc oxide ZnO) and GZO (gallium oxide $Ga_2O_3$+ ZnO) having a stable amorphous structure can be widely used.

The protective insulating film 14 is formed so as to cover the semiconductor film 12. The upper-layer source electrode 21 and the upper-layer drain electrode 23 to be electrically connected to the source electrode 7 and the drain electrode 8 that are formed therebelow, respectively, and to the semiconductor film 12 through the contact holes provided in the protective insulating film 14 are provided so as to be electrically connected to the source electrode and the drain electrode of the TFT 201 on the upper and lower surfaces of the semiconductor film 12. This increases the contact area between the semiconductor film 12 and each of the source electrode and the drain electrode, which enables to reduce an interface resistance further.

Even if the interface resistance of one of two interfaces between the source electrode 7 and the semiconductor film 12 and between the upper-layer source electrode 21 and the semiconductor film 12 is high, the other interface thereof can compensate for the high interface resistance. Also, even if the interface resistance of one of two interfaces between the drain electrode 8 and the semiconductor film 12 and between the upper-layer drain electrode 23 and the semiconductor film 12 is high, the other interface thereof can compensate for the high interface resistance. Accordingly, an interface resistance can be kept low and also the generation of defects due to poor TFT characteristics can be prevented.

The upper-layer source electrode 21 and the upper-layer drain electrode 23 are formed of an oxide conductive film. Therefore, an interface reaction (redox reaction) between each of them and the semiconductor film 12 of the same oxide can be prevented, and an interface resistance can be reduced.

Further, source wiring is formed of two layers including the source wire 9 and the upper-layer source wire 22 that is electrically connected to the source wire 9 through a plurality of source-wire-portion contact holes 16 provided at regular intervals in the protective insulating film 14. Therefore, even in a case where a poor pattern is generated in one source wire and the source wire is broken, the other source wire can compensate for the broken one, which enables to efficiently prevent an occurrence of defects due to breaking.

As described above, in the TFT substrate and the method of manufacturing the same according to the third preferred embodiment, even in a case where an oxide semiconductor is used for a semiconductor active layer, the interface resistance between the semiconductor active layer and each of the upper-layer source electrode and the upper-layer drain electrode can be kept low. Besides, an occurrence of defects due to a poor wring pattern can be prevented efficiently.

Besides, a TFT substrate whose operating speed is high and a display device including the same can be manufactured at high yield by achieving a TFT substrate including a high-mobility oxide-based semiconductor film. Accordingly, a high-performance TFT substrate and a liquid crystal display device can be manufactured with high productivity.

<Modification>

The third preferred embodiment has described that the TFT substrate 200 is used in a transmissive liquid crystal display device. Hereinafter, as a modification thereof, the configuration in a case where the TFT substrate 200 is used in a semi-transmissive liquid crystal display device is described with reference to FIG. 27.

The planar configuration shown in FIG. 27 is basically the same as that of the pixel 204A shown in FIG. 9. FIG. 27 is a cross-sectional view showing the cross-sectional configuration of a portion corresponding to the line X-X in FIG. 9, the cross-sectional configuration of a portion corresponding to the line Y-Y in FIG. 9, and the cross-sectional configuration of a portion corresponding to the line Z-Z in FIG. 9 by portion (a), portion (b), and portion (c), respectively. The same components as those of the pixel 204D shown in FIG. 21 are denoted by the same reference symbols, and repetitive description is omitted.

As shown in FIG. 27, the pixel 204E is configured such that a lower-layer pixel electrode 211 extends from the drain electrode 8 formed of a conductive film therebelow. A light reflecting surface (not shown) is formed of Al or Ag having high light reflectance and an alloy film containing the above as a main component as the surface (surface on the side opposite to the counter substrate) of the lower-layer pixel electrode 211, so that a TFT substrate suitable for a semi-transmissive liquid crystal display device including a pixel display portion that operates through light transmission and reflection can be manufactured.

The ratio between the transmissive display area and reflective display area of the pixel 204E can be appropriately changed by changing the area ratio of the lower-layer pixel electrode 211 extending from the drain electrode 8. Through such formation that the lower-layer pixel electrode 211 is formed to have a size equal to or larger than that of the pixel electrode 223 formed thereabove, a totally reflective liquid crystal display device can be obtained.

As described above, with the configuration in which the lower-layer pixel electrode 211 extends from the drain electrode 8 below the pixel electrode 223 formed thereabove, a TFT substrate suitable for a semi-transmissive liquid crystal display device can be manufactured without adding a new photolithographic step.

<Fourth Preferred Embodiment>

A fourth preferred embodiment of the present invention is described with reference to FIGS. 28 to 35. The fourth preferred embodiment adopts a top gate structure in which the gate electrode 2 is formed as the uppermost layer as in the second preferred embodiment.

<Configuration of Pixel of TFT Substrate>

First, the configuration of a pixel 204F according to the fourth preferred embodiment is described with reference to FIG. 28. The planar configuration thereof is basically the same as that of the pixel 204B shown in FIG. 11. FIG. 28 is a cross-sectional view showing the cross-sectional configuration of a portion corresponding to the line X-X in FIG. 11, the cross-sectional configuration of a portion corresponding to the line Y-Y in FIG. 11, and the cross-sectional configuration of a portion corresponding to the line Z-Z in FIG. 11 by portion (c), portion (a), and portion (b), respectively. The same components as those of the pixel 204B shown in FIGS. 11 and 12 are denoted by the same reference symbols, and repetitive description is omitted. Further, description is given below assuming that the TFT substrate 200 is used in a transmissive liquid crystal display device.

As shown in FIG. 28, the TFT substrate is formed on the substrate 1 being a transparent insulating substrate such as glass, and the same conductive film is selectively disposed on the substrate 1 to form wires and electrodes. That is, the source terminal 10 is disposed in the source terminal portion shown in the portion (b) of FIG. 28. The source wire 9 is disposed in the wire intersecting portion shown in the portion (c) of FIG. 28. In the TFT portion shown in the portion (c) of FIG. 28, the source electrode 7 and the drain electrode 8 are disposed to be spaced from each other, and the semiconductor film 12 is disposed so as to straddle the source electrode 7 and the drain electrode 8. The insulating film 106 is disposed so as to entirely cover the substrate 1. The insulating film 106 functions as a gate insulating film in the TFT portion, and thus may be referred to as first gate insulating film 106.

The semiconductor film 12 is electrically connected to the source electrode 7 and the drain electrode 8 with parts of the bottom surface thereof being in contact with parts of the surfaces of the source electrode 7 and the drain electrode 8. The channel portion 13 is formed in the surface of the semiconductor film 12 provided on the substrate 1 between the source electrode 7 and the drain electrode 8.

The semiconductor film 12 is, for example, an oxide-based semiconductor film. The use of the oxide-based semiconductor film as a channel layer can achieve higher mobility than that of amorphous silicon. Specifically, zinc oxide (ZnO)-based films, InGaZnO-based films obtained by adding a gallium oxide ($Ga_2O_3$) and an indium oxide ($In_2O_3$) to a zinc oxide (ZnO) can be used as the oxide-based semiconductor film.

A plurality of contact holes are formed in the first gate insulating film 106. That is, as shown in the portion (c) of FIG. 28, the source-electrode-portion contact hole 15 and the drain-electrode-portion contact hole 17 are formed so as to pass through the first gate insulating film 106 and reach the semiconductor film 12.

The source-wire-portion contact hole 16 that passes through the first gate insulating film 106 and reaches the source wire 9 is formed, and the pixel-drain contact hole 18 that passes through the first gate insulating film 106 and reaches the drain electrode 8 is formed.

The upper-layer source electrode 21 is disposed, which is in contact with and is electrically connected to the surface of the semiconductor film 12 formed therebelow, through the source-electrode-portion contact hole 15. The upper-layer source wire 22 is disposed, which is in contact with and is electrically connected to the surface of the source wire 9 formed therebelow, through the source-wire-portion contact hole 16.

The upper-layer source electrode 21 and the upper-layer source wire 22 are integrally formed, and the source electrode 7 is electrically connected to the upper-layer source electrode 21 via the source wire 9.

The upper-layer drain electrode 23 is disposed, which is in contact with and is electrically connected to the surface of the semiconductor film 12 formed therebelow, through the drain-electrode-portion contact hole 17.

The upper-layer drain electrode 23 is in contact with and is electrically connected to the surface of the drain electrode 8 formed therebelow, through the pixel-drain contact hole 18. Thus, the upper-layer drain electrode 23 is configured to electrically connect the drain electrode 8 and the semiconductor film 12.

The upper-layer drain electrode 23 extends up to below the auxiliary capacitance electrode 5 of the auxiliary capacitance portion as the pixel electrode 223 in the pixel electrode portion. As described above, in the pixel 204F according to the fourth preferred embodiment, the pixel electrode 223 is configured to extend from the upper-layer drain electrode 23, and the pixel electrode 223 is disposed above the semiconductor film 12. The TFT substrate 200 is used in a transmissive liquid crystal display device, and thus, the pixel electrode 223 is formed of a light-transmitting conductive film.

As shown in the portion (b) of FIG. 28, the first source-terminal-portion contact hole 120 is formed so as to pass through the first gate insulating film 106 and reach the source terminal 10. Besides, the upper-layer source terminal 125 is disposed, which is in contact with and is electrically connected to the surface of the source terminal 10 formed therebelow through the first source-terminal-portion contact hole 120.

Further, the second gate insulating film 114 is formed so as to entirely cover the substrate 1 including the upper-layer source electrode 21 and the upper-layer source wire 22. In the second gate insulating film 114, in the source terminal portion shown in the portion (b) of FIG. 28, the second source-terminal-portion contact hole 220 for exposing the surface of the upper-layer source terminal 125 is formed, and the source terminal pad 225 that is in contact with the upper-layer source terminal 125 to be electrically connected thereto through the second source-terminal-portion contact hole 220 is disposed.

The gate wire 103 is disposed in the wire intersecting portion shown in the portion (c) of FIG. 28, the gate electrode 102 is disposed in the TFT portion shown therein, and the auxiliary capacitance electrode 105 is disposed in the auxiliary capacitance portion shown therein. The gate terminal pad 104 is disposed in the gate terminal portion shown in the portion (a) of FIG. 28.

<Manufacturing Method>

Next, a method of manufacturing the TFT substrate according to the fourth preferred embodiment is described with reference to FIGS. 29 to 34. The cross-sectional view showing the last step corresponds to FIG. 28, and the portions (a) to (c) of FIG. 28 respectively represent the same portions in the cross-sectional views illustrating the manufacturing steps in the description below.

First, the substrate 1 is cleaned with a cleaning fluid or pure water. Here, a glass substrate having a thickness of 0.5 mm is used as the substrate 1. Then, a first conductive film (not shown) is deposited entirely on one main surface of the cleaned substrate 1.

For example, Cr, Mo, Ti, Cu, Ta, W, Al, and alloys thereof obtained by adding trace amounts of other elements thereto can be used as the first conductive film. Alternatively, the first conductive film may have a laminated structure obtained by forming two or more layers of the metals and alloys thereof. The use of the metals and alloys thereof enables to obtain a low-resistance film having a resistivity value of 50 $\mu\Omega cm$ or less.

In the fourth preferred embodiment, a Mo film is used as the first conductive film, and the Mo film is deposited to have a thickness of 200 nm by a well-known sputtering process using an Ar gas. After that, a resist material is applied onto the Mo film, and a photoresist pattern is formed through a photolithographic step (first time). Then, the Mo film is patterned by etching with the photoresist pattern being an etching mask, and the photoresist pattern is removed. As a result, as shown in FIG. 29, the source terminal 10, source wire 9, source electrode 7, and drain electrode 8 are formed on the substrate 1. In this etching step, well-known wet etching with a solution containing phosphoric acid, nitric acid, and acetic acid is used.

Next, in the step shown in FIG. 30, the semiconductor film 12 is formed so as to straddle the source electrode 7 and the drain electrode 8.

In the formation of the semiconductor film 12, first, an oxide-based semiconductor film (InGaZnO film) containing In, Ga, and Zn is formed entirely on one main surface of the substrate 1. The oxide-based semiconductor film is deposited by the sputtering process using an InGaZnO target, and here, is deposited by the sputtering process with an Ar gas using an InGaZnO target where an atomic composition ratio of In:Ga:Zn:O is 1:1:1:4. In this case, an atomic composition ratio of oxygen is normally smaller than that of the stoichiometric composition, resulting in an oxide film in an oxygen and ion deficient state (in the example above, the composition ratio of O is less than four). Therefore, it is desirable to perform sputtering with an Ar gas mixed with an oxygen ($O_2$) gas.

In the fourth preferred embodiment, sputtering is performed with a mixed gas obtained by adding, at a division ratio, a 10% of $O_2$ gas to an Ar gas, and an InGaZnO film is deposited to have a thickness of 50 nm. The InGaZnO film is deposited to have an amorphous structure. The crystallization temperature of the InGaZnO film having an amorphous structure is typically 500° C. or higher, and most of the film is stable while having an amorphous structure at a room temperature.

After that, a resist material is applied onto the InGaZnO film, and a photoresist pattern is formed through the photolithographic step (second time). Then, the InGaZnO film is patterned by etching with the photoresist pattern being an etching mask, and the photoresist pattern is removed. As a result, as shown in FIG. 30, the semiconductor film 12 that straddles the source electrode 7 and the drain electrode 8 is obtained.

In the step of etching the InGaZnO film, well-known wet etching with an oxalic-acid-based solution can be used.

On this occasion, the source electrode 7, drain electrode 8, source wire 9, and source terminal 10 that have been formed in the preceding steps are formed of a Mo film and are not etched with an oxalic-acid-based solution. Therefore, the pattern does not disappear.

Next, in the step shown in FIG. 31, the first gate insulating film 106 is deposited entirely on one main surface of the substrate 1, to thereby cover the source electrode 7, drain electrode 8, source wire 9, source terminal 10, and semiconductor film 12.

The first gate insulating film 106 can be obtained by forming a silicon oxide (SiO) film by a CVD process. Here, a silicon oxide film having a thickness of 200 nm is deposited under a substrate heating condition of approximately 250° C. The silicon oxide film has weak barrier properties against ($H_2O$), hydrogen ($H_2$), or impurity elements that affect TFT characteristics, such as sodium (Na) and potassium (K), and thus may have a laminated structure in which, for example, a silicon nitride (SiN) film having excellent barrier properties or the like is provided below the silicon oxide film.

After that, a resist material is applied onto the silicon oxide film, and a photoresist pattern is formed through the photolithographic step (third time). Then, the silicon oxide film is etched with the photoresist pattern being an etching mask.

In this etching step, a well-known dry etching process using a fluorine-based gas can be used. Through this step, the source-electrode-portion contact hole 15, source-wire-portion contact hole 16, drain-electrode-portion contact hole 17, pixel-drain contact hole 18, and first source-terminal-portion contact hole 120 passing through the first gate insulating film 106 are formed.

The source-electrode-portion contact hole 15 and the drain-electrode-portion contact hole 17 are provided to reach the surface of the semiconductor film 12 above the source electrode 7 and the drain electrode 8, respectively. The source-wire-portion contact hole 16 is provided to reach the surface of the source wire 9, and the pixel-drain contact hole 18 is provided to reach the surface of the drain electrode 8. The first source-terminal-portion contact hole 120 is provided to reach the surface of the source terminal 10.

Next, in the step shown in FIG. 32, the upper-layer source electrode 21, upper-layer source wire 22, upper-layer drain electrode 23, and upper-layer source terminal 125 are formed.

In the formation of them, first, a second conductive film (not shown) is formed entirely on one main surface of the substrate 1.

It suffices that the second conductive film is light-transmitting. For example, an ITO film, an IZO (indium oxide $In_2O_3$+ zinc oxide ZnO) film, and a GZO (gallium oxide $Ga_2O_3$+ ZnO) film may be selected.

A resist material is applied onto the second conductive film, and a photoresist pattern is formed through the photolithographic step (fourth time). Then, the second conductive film is patterned by etching with the photoresist pattern being an etching mask, and the photoresist pattern is removed. As a result, as shown in FIG. 32, the upper-layer source electrode 21, upper-layer source wire 22, upper-layer drain electrode 23, pixel electrode 223, gate terminal pad 24, and source terminal pad 25 are formed.

In this etching step, in a case where an ITO film is selected for the second conductive film, well-known wet etching with an oxalic-acid-based solution can be used.

The upper-layer source wire 22 is in contact with and is electrically connected to the surface of the source wire 9 formed therebelow, through the source-wire-portion contact hole 16.

The upper-layer source wire 22 and the upper-layer source electrode 21 are integrally formed, and the upper-layer source electrode 21 is in contact with and is electrically connected to the surface of the semiconductor film 12 above the source electrode 7 formed therebelow, through the source-electrode-portion contact hole 15. Accordingly, the upper-layer source electrode 21 and the upper-layer source wire 22 are configured to electrically connect the semiconductor film 12 and the source electrode 7 through the source-electrode-portion contact hole 15, the source-wire-portion contact hole 16, and the source wire 9.

The upper-layer drain electrode 23 is in contact with and is electrically connected to the surface of the semiconductor film 12 on the drain electrode 8 formed therebelow, through the drain-electrode-portion contact hole 17. Further, the upper-layer drain electrode 23 is in contact with and is electrically connected to the surface of the drain electrode 8 formed therebelow, through the pixel-drain contact hole 18. Therefore, the upper-layer drain electrode 23 is configured to electrically connect the semiconductor film 12, the drain electrode 8, and the pixel electrode 223 through the drain-electrode-portion contact hole 17 and the pixel-drain contact hole 18.

The second conductive film is an oxide conductive film. Therefore, in the portions in which the upper-layer source electrode 21 and the upper-layer drain electrode 23 are in contact with the semiconductor film 12 being an InGaZnO-based semiconductor film, an interface reaction (redox reaction) therebetween can be prevented. This enables to suppress the contact resistance (interface resistance) in the interface portion between the semiconductor film 12 and each of the upper-layer source electrode 21 and the upper-layer drain electrode 23, leading to an effect that the on-current and mobility are increased to improve TFT characteristics.

The first source-terminal-portion contact hole 120 is formed for exposing the surface of the source terminal 10, where the upper-layer source terminal 125 is electrically connected to the source terminal 10 formed therebelow, through the first source-terminal-portion contact hole 120.

Next, in the step shown in FIG. 33, the second gate insulating film 114 is deposited entirely on one main surface of the substrate 1 so as to cover the upper-layer source electrode 21, upper-layer source wire 22, upper-layer drain electrode 23, pixel electrode 223, and upper-layer source terminal 125.

The second gate insulating film 114 can be obtained by forming a silicon oxide (SiO) film by a CVD process. Here, the silicon oxide film is deposited to have a thickness of 200 nm under a substrate heating condition of approximately 250° C.

After that, a resist material is applied onto the silicon oxide film, and a photoresist pattern is formed through the photolithographic step (fifth time). Then, the silicon oxide film is etched with the photoresist pattern being an etching mask.

In this etching step, a well-known dry etching process using a fluorine-based gas can be used. Through this step, the second source-terminal-portion contact hole 220 passing through the second gate insulating film 114 is formed.

The second source-terminal-portion contact hole 220 is formed for exposing the surface of the upper-layer source terminal 125.

Next, in the step shown in FIG. 34, the gate terminal pad 104, source terminal pad 225, gate wire 103, gate electrode 102, and auxiliary capacitance electrode 105 are formed.

In the formation of them, first, a third conductive film is formed entirely on one main surface of the substrate 1. For example, Cr, Mo, Ti, Cu, Ta, W, Al, and alloys thereof obtained by adding trace amounts of other elements thereto can be used as the third conductive film. Alternatively, the third conductive film may have a laminated structure obtained by forming two or more layers of the metals and alloys thereof. The use of the metals and alloys thereof enables to obtain a low-resistance film having a resistivity value of 50 μΩcm or less.

In the fourth preferred embodiment, a Mo film is used as the third conductive film, and the Mo film is deposited to have a thickness of 200 nm by a well-known sputtering process using an Ar gas. After that, a resist material is applied onto the Mo film, and a photoresist pattern is formed through the photolithographic step (sixth time). Then, the Mo film is patterned by etching with the photoresist pattern being an etching mask, and the photoresist pattern is removed. As a result, as shown in FIG. 34, the gate terminal pad 104, source terminal pad 225, gate wire 103, gate electrode 102, and auxiliary capacitance electrode 105 are formed.

The source terminal pad 225 is electrically connected to the upper-layer source terminal 125 through the second source-terminal-portion contact hole 220.

In this etching step, well-known wet etching with a solution containing phosphoric acid, nitric acid, and acetic acid can be used. Through the steps described above, the TFT substrate is completed.

<Effects>

As described above, in the method of manufacturing the TFT substrate according to the fourth preferred embodiment, a high-performance TFT substrate for a liquid crystal display device that includes an oxide semiconductor for a semiconductor active layer can be manufactured through six photolithographic steps.

In the pixel 204F of the fourth preferred embodiment, though the source electrode 7 and the drain electrode 8 are formed of a metal film such as Mo film, the semiconductor film 12 is formed after the formation of the source electrode 7 and the drain electrode 8. Accordingly, even in a case where an oxide-based semiconductor film having a low resistance to solution is used as the semiconductor film 12, the semiconductor film 12 can be processed through selective etching without being affected by etching of the source electrode 7, the drain electrode 8, and the like.

Although the source electrode 7, the drain electrode 8, and the like are formed of a metal film such as Mo film, they are not etched with an oxalic-acid-based solution being an etching solution for the semiconductor film 12 formed of a ZnO-based or InGaZnO-based oxide semiconductor. This enables selective etching.

Further, the pixel electrode 223 is formed in the step after the formation of the semiconductor film 12, which prevents the pixel electrode 223 from disappearing during etching of the semiconductor film 12 formed of a ZnO-based or InGaZnO-based oxide semiconductor.

The first gate insulating film 106 is formed so as to cover the semiconductor film 12. The upper-layer source electrode 21 and the upper-layer drain electrode 23 to be electrically connected to the source electrode 7 and the drain electrode 8 that are formed therebelow, respectively, and to the semiconductor film 12 through the contact holes provided in the first gate insulating film 106 are provided so as to be electrically connected to the source electrode and the drain electrode of the TFT 201 on the upper and lower surfaces of the semiconductor film 12. This increases the contact area between the semiconductor film 12 and each of the source electrode and the drain electrode, which enables to reduce an interface resistance further.

Even if the interface resistance of one of two interfaces between the source electrode 7 and the semiconductor film 12 and between the upper-layer source electrode 21 and the semiconductor film 12 is high, the other interface thereof can compensate for the high interface resistance. Also, even if the interface resistance of one of two interfaces between the drain electrode 8 and the semiconductor film 12 and between the upper-layer drain electrode 23 and the semiconductor film 12 is high, the other interface thereof can compensate for the high interface resistance. Accordingly, an interface resistance can be kept low and also the generation of defects due to poor TFT characteristics can be prevented.

The upper-layer source electrode 21 and the upper-layer drain electrode 23 are formed of an oxide conductive film. Therefore, an interface reaction (redox reaction) between each of them and the semiconductor film 12 of the same oxide can be prevented, and an interface resistance can be reduced.

Further, source wiring is formed of two layers including the source wire 9 and the upper-layer source wire 22 that is electrically connected to the source wire 9 through a plurality of source-wire-portion contact holes 16 provided at regular intervals in the second gate insulating film 114. Therefore, even in a case where a poor pattern is generated in one source wire and the source wire is broken, the other source wire can compensate for the broken one, which enables to efficiently prevent an occurrence of defects due to breaking.

While the gate electrode 102, gate wire 103, and the like are formed of a metal film of Mo or the like, even in a case where a strong acid solution such as phosphoric acid and nitric acid is used in the formation of them, the pixel electrode 223 is covered with and protected by the second gate insulating film 114, and thus does not disappear.

Therefore, the pixel electrode 223 needs not to be limited to an ITO film having a polycrystalline structure with high chemical stability. In addition to an ITO film, materials that are susceptible to solutions such as IZO (indium oxide $In_2O_3$+zinc oxide ZnO) and GZO (gallium oxide $Ga_2O_3$+ ZnO) having a stable amorphous structure can be widely used.

As described above, in the TFT substrate and the method of manufacturing the same according to the fourth preferred embodiment, even in a case where an oxide semiconductor is used for a semiconductor active layer, the interface resistance between the semiconductor active layer and each of the upper-layer source electrode and the upper-layer drain electrode can be kept low. Besides, an occurrence of defects due to a poor wring pattern can be prevented efficiently.

Besides, a TFT substrate whose operating speed is high and a display device including the same can be manufactured at high yield by achieving a TFT substrate including a high-mobility oxide-based semiconductor film. Accordingly, a high-performance TFT substrate and a liquid crystal display device can be manufactured with high productivity.

<Modification>

The fourth preferred embodiment has described that the TFT substrate 200 is used in a transmissive liquid crystal display device. Hereinafter, as a modification thereof, the configuration in a case where the TFT substrate 200 is used in a semi-transmissive liquid crystal display device is described with reference to FIG. 35.

The planar configuration shown in FIG. 35 is basically the same as that of the pixel 204C shown in FIG. 19. FIG. 35 is a cross-sectional view showing the cross-sectional configuration of a portion corresponding to the line X-X in FIG. 19, the cross-sectional configuration of a portion corresponding to the line Y-Y in FIG. 19, and the cross-sectional configuration of a portion corresponding to the line Z-Z in FIG. 19 by portion (a), portion (b), and portion (c), respectively. The same components as those of the pixel 204F shown in FIG. 28 are denoted by the same reference symbols, and repetitive description is omitted.

As shown in FIG. 35, the pixel 204G is configured such that the lower-layer pixel electrode 211 extends from the drain electrode 8 formed of a conductive film therebelow. A light reflecting surface (not shown) is formed of Al or Ag having high light reflectance and an alloy film containing the above as a main component as the surface (surface on the side opposite to the counter substrate) of the lower-layer pixel electrode 211, so that a TFT substrate suitable for a semi-transmissive liquid crystal display device including a pixel display portion that operates through light transmission and reflection can be manufactured.

The ratio between the transmissive display area and reflective display area of the pixel 204G can be appropriately changed by changing the area ratio of the lower-layer pixel electrode 211 extending from the drain electrode 8. Through such formation that the lower-layer pixel electrode 211 is formed to have a size equal to or larger than that of the pixel electrode 223 formed thereabove, a totally reflective liquid crystal display device can be obtained.

As described above, with the configuration in which the lower-layer pixel electrode 211 extends from the drain electrode 8 below the pixel electrode 223 formed thereabove, a TFT substrate suitable for a semi-transmissive liquid crystal display device can be manufactured without adding a new photolithographic step.

<Other Example of Semiconductor Film>

While the first to fourth preferred embodiments and the modifications thereof have described the examples in which an oxide semiconductor (InGaZnO) formed of an indium oxide, a gallium oxide, and a zinc oxide is applied as the semiconductor film 12, the material of the oxide-based semiconductor film is not limited thereto.

For example, in addition to an indium oxide, a gallium oxide, and a zinc oxide, any of a tin oxide, aluminum oxide, magnesium oxide, iron oxide, nickel oxide, silicon oxide, germanium oxide, and the like, or oxides containing the above as a main component and having semiconductor characteristics can be used.

Note that in this specification, the main component refers to a component with the highest composition ratio among two or more components that constitute a material.

<Other Application of Invention>

The TFT substrate according to the present invention may be used in display devices other than liquid crystal display devices and, for example, is applicable to electro-optical display devices such as organic electroluminescence (EL) displays. Further, the TFT substrate is applicable to thin film transistors and active matrix substrates for use in semiconductor components other than display devices.

The embodiments of the present invention can be combined freely or can be appropriately modified or omitted within the scope of the present invention.

While the invention has been shown and described in detail, the foregoing description is in all aspects illustrative and not restrictive. It is therefore understood that numerous modifications and variations can be devised without departing from the scope of the invention.

What is claimed is:

1. A thin film transistor substrate including a plurality of pixels arranged in matrix, wherein
each of said pixels comprising:
a thin film transistor including:
a source electrode and a drain electrode located to be spaced from each other on the same plane;
a semiconductor film having an upper side and a lower side located to straddle said source electrode and said drain electrode such that said lower side is positioned to contact said source electrode and said drain electrode;
an insulating film located to cover at least said source electrode, said drain electrode, and said semiconductor film;
first and second contact holes passing through said insulating film and reaching said semiconductor film located on said source electrode and said drain electrode, respectively;
an upper-layer source electrode and an upper-layer drain electrode located on said insulating film and connected to said upper side of said semiconductor film through said first and second contact holes, respectively; and
a gate electrode located below or above said semiconductor film;
a source wire extending from said source electrode;
an upper-layer source wire extending from said upper-layer source electrode;
third and fourth contact holes passing through said insulating film and reaching said source wire and said drain electrode, respectively; and
a pixel electrode electrically connected to said drain electrode,
wherein said upper-layer source wire and said upper-layer drain electrode are connected to said source wire and said drain electrode through said third and fourth contact holes, respectively.

2. The thin film transistor substrate according to claim 1, wherein
said gate electrode is disposed on a substrate,
said thin film transistor includes a gate insulating film located on an entire surface of said substrate so as to cover said gate electrode,
said source electrode and said drain electrode are disposed on said gate insulating film,
said semiconductor film is in contact with said gate insulating film between said source electrode and said drain electrode, and
said pixel electrode is disposed on said gate insulating film so as to extend from said drain electrode.

3. The thin film transistor substrate according to claim 2, wherein
said source electrode, said drain electrode, said source wire, and said pixel electrode are formed of a conductive oxide, and
said semiconductor film is formed of an oxide.

4. The thin film transistor substrate according to claim 3, wherein said semiconductor film is formed of an oxide including at least an indium oxide, a gallium oxide, and a zinc oxide.

5. The thin film transistor substrate according to claim 2, wherein
said conductive oxide is light-transmitting,
said insulating film covers said pixel electrode, and
said thin film transistor further includes an upper-layer pixel electrode extending from said upper-layer drain electrode so as to cover at least a part above said pixel electrode via said insulating film, said upper-layer pixel electrode having a light reflecting surface as a surface thereof.

6. The thin film transistor substrate according to claim 1, wherein
said source electrode and said drain electrode are disposed on a substrate,
said semiconductor film is in contact with said substrate between said source electrode and said drain electrode,
said pixel electrode is disposed on said substrate so as to extend from said drain electrode,
said gate electrode is disposed above said semiconductor film, and
said insulating film functions as a gate insulating film between said semiconductor film and said gate electrode.

7. The thin film transistor substrate according to claim 6, wherein
said source electrode, said drain electrode, said source wire, and said pixel electrode are formed of a conductive oxide, and
said semiconductor film is formed of an oxide.

8. The thin film transistor substrate according to claim 7, wherein said semiconductor film is formed of an oxide including at least an indium oxide, a gallium oxide, and a zinc oxide.

9. The thin film transistor substrate according to claim 6, wherein
said conductive oxide is light-transmitting,
said insulating film covers said pixel electrode, and
said thin film transistor further includes an upper-layer pixel electrode extending from said upper-layer drain electrode so as to cover at least a part above said pixel electrode via said insulating film, said upper-layer pixel electrode having a light reflecting surface as a surface thereof.

10. The thin film transistor substrate according to claim 1, wherein
said gate electrode is disposed on a substrate,
said thin film transistor includes a gate insulating film located on an entire surface of said substrate so as to cover said gate electrode,
said source electrode and said drain electrode are disposed on said gate insulating film,
said semiconductor film is in contact with said gate insulating film between said source electrode and said drain electrode, and
said pixel electrode is disposed on said insulating film so as to extend from said upper- layer drain electrode.

11. The thin film transistor substrate according to claim 10, wherein
said upper-layer source electrode, said upper-layer drain electrode, said upper-layer source wire, and said pixel electrode are formed of a conductive oxide, and
said semiconductor film is formed of an oxide.

12. The thin film transistor substrate according to claim 11, wherein said semiconductor film is formed of an oxide including at least an indium oxide, a gallium oxide, and a zinc oxide.

13. The thin film transistor substrate according to claim 10, wherein
said conductive oxide is light-transmitting,
said insulating film covers said gate insulating film, and
said thin film transistor further includes a lower-layer pixel electrode extending from said drain electrode so as to cover at least a part below said pixel electrode via said insulating film, said lower-layer pixel electrode having a light reflecting surface as a surface thereof.

14. The thin film transistor substrate according to claim 1, wherein
said source electrode and said drain electrode are disposed on a substrate,
said semiconductor film is in contact with said substrate between said source electrode and said drain electrode,
said pixel electrode is disposed on said insulating film so as to extend from said upper- layer drain electrode, said gate electrode is disposed above said semiconductor film, and
said insulating film functions as a gate insulating film between said semiconductor film and said gate electrode.

15. The thin film transistor substrate according to claim 14, wherein
said upper-layer source electrode, said upper-layer drain electrode, said upper-layer source wire, and said pixel electrode are formed of a conductive oxide, and
said semiconductor film is formed of an oxide.

16. The thin film transistor substrate according to claim 15, wherein said semiconductor film is formed of an oxide including at least an indium oxide, a gallium oxide, and a zinc oxide.

17. The thin film transistor substrate according to claim 14, wherein
said conductive oxide is light-transmitting,
said insulating film covers said gate insulating film, and
said thin film transistor further includes a lower-layer pixel electrode extending from said drain electrode so as to cover at least a part below said pixel electrode via said insulating film, said lower-layer pixel electrode having a light reflecting surface as a surface thereof.

* * * * *